United States Patent
Hou et al.

(10) Patent No.: US 12,272,315 B2
(45) Date of Patent: Apr. 8, 2025

(54) METHOD OF DRIVING SCAN CIRCUIT, SCAN CIRCUIT, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Shuai Hou, Beijing (CN); Shuai Chen, Beijing (CN); Bin Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/041,993

(22) PCT Filed: May 10, 2022

(86) PCT No.: PCT/CN2022/091837
§ 371 (c)(1),
(2) Date: Feb. 16, 2023

(87) PCT Pub. No.: WO2023/216086
PCT Pub. Date: Nov. 16, 2023

(65) Prior Publication Data
US 2024/0265876 A1     Aug. 8, 2024

(51) Int. Cl.
*G09G 3/36*     (2006.01)
*G09G 3/3233*     (2016.01)
*G09G 3/3266*     (2016.01)

(52) U.S. Cl.
CPC ......... *G09G 3/3266* (2013.01); *G09G 3/3233* (2013.01); *G09G 2300/0408* (2013.01);
(Continued)

(58) Field of Classification Search
None
See application file for complete search history.

(56) References Cited

U.S. PATENT DOCUMENTS

| | | |
|---|---|---|
| 2006/0007083 A1 | 1/2006 | Pai et al. |
| 2006/0164350 A1 | 7/2006 | Kim et al. |

(Continued)

FOREIGN PATENT DOCUMENTS

| | | |
|---|---|---|
| CN | 1908750 A | 2/2007 |
| CN | 101122697 A | 2/2008 |

(Continued)

OTHER PUBLICATIONS

International Search Report & Written Opinion mailed Nov. 25, 2022, regarding PCT/CN2022/091837.

*Primary Examiner* — Carl Adams
(74) *Attorney, Agent, or Firm* — Intellectual Valley Law, P.C.

(57) ABSTRACT

A method of driving a scan circuit includes providing N number of first clock signals time-sequentially to (k*N) number of stages of the scan circuit, respectively. The (k*N) number of stages includes M number of groups. A respective group of the M number of groups includes one or more stages of the scan circuit. A respective first clock signal of the N number of first clock signals includes a first level component and a second level component. With respect to N number of data enabling signals, a difference between a starting point of a first level component of an n-th first clock signal and a starting point of an n-th data enabling signal of the N number of data enabling signals is equal to $t_{m1}$. Values of $t_{m1}$ for first clock signals provided to different groups of the M number of groups are different.

18 Claims, 22 Drawing Sheets

(52) U.S. Cl.
CPC ............ *G09G 2300/0852* (2013.01); *G09G 2310/0286* (2013.01); *G09G 2320/0233* (2013.01)

(56) References Cited

U.S. PATENT DOCUMENTS

| | | |
|---|---|---|
| 2007/0052656 A1 | 3/2007 | Park et al. |
| 2015/0145852 A1* | 5/2015 | Ahn .................. G09G 3/3677 345/99 |
| 2015/0294614 A1 | 10/2015 | Duan et al. |
| 2015/0294632 A1 | 10/2015 | Chen et al. |
| 2017/0003775 A1 | 1/2017 | Hu et al. |
| 2019/0371240 A1 | 12/2019 | Mitani et al. |
| 2020/0098311 A1 | 3/2020 | Hsu et al. |
| 2021/0027679 A1 | 1/2021 | Kwon et al. |
| 2021/0174758 A1 | 6/2021 | Liu et al. |
| 2021/0375178 A1 | 12/2021 | Luo et al. |

FOREIGN PATENT DOCUMENTS

| | | |
|---|---|---|
| CN | 103236241 A | 8/2013 |
| CN | 103777422 A | 5/2014 |
| CN | 104932134 A | 9/2015 |
| CN | 105139823 A | 12/2015 |
| CN | 108877639 A | 11/2018 |
| CN | 109272921 A | 1/2019 |
| CN | 109959905 A | 7/2019 |
| CN | 110085156 A | 8/2019 |
| CN | 110119331 A | 8/2019 |
| CN | 111653236 A | 9/2020 |
| CN | 111934842 A | 11/2020 |
| CN | 112309298 A | 2/2021 |
| CN | 113452502 A | 9/2021 |
| JP | 2005070444 A | 3/2005 |
| KR | 20060070336 A | 6/2006 |

* cited by examiner

METHOD OF DRIVING SCAN CIRCUIT, SCAN CIRCUIT, AND DISPLAY APPARATUS

CROSS-REFERENCE TO RELATED APPLICATION

This application is a national stage application under 35 U.S.C. § 371 of International Application No. PCT/CN2022/091837, filed May 10, 2022, the contents of which are incorporated by reference in the entirety.

TECHNICAL FIELD

The present invention relates to display technology, more particularly, to a method of driving a scan circuit, a scan circuit, and a display apparatus.

BACKGROUND

Image display apparatuses include a driver for controlling image display in each of a plurality of pixels. The driver is a transistor-based circuit including a gate driving circuit and a data driving circuit. The gate driving circuit is formed by cascading multiple units of shift register units. Each shift register unit outputs a gate driving signal to one of a plurality of gate lines. The gate driving signals from the gate driving circuit scan through gate lines row by row, controlling each row of transistors to be in on/off states. The gate drive circuit can be integrated into a gate-on-array (GOA) circuit, which can be formed directly in the array substrate of the display panel.

SUMMARY

In one aspect, the present disclosure provides a method of driving a scan circuit, comprising providing N number of first clock signals time-sequentially to (k*N) number of stages of the scan circuit, respectively, the (k*N) number of stages comprising M number of groups, a respective group of the M number of groups comprising one or more stages of the scan circuit, N, k, M being integers; N≥2, k≥1; M≥2; wherein a respective first clock signal of the N number of first clock signals comprises a first level component and a second level component following the first level component; a m-th group of the M number of groups is configured to receive first clock signals before a (m+1)-th group of the M number of groups receives first clock signals, 1≤m≤(M−1); with respect to N number of data enabling signals, a difference between a starting point of a first level component of an n-th first clock signal and a starting point of an n-th data enabling signal of the N number of data enabling signals is equal to $t_{m1}$; values of $t_{m1}$ for first clock signals provided to different groups of the M number of groups are different; and the N number of data enabling signals are signals provided to a timing controller coupled to the scan circuit, and configured to control a timing of data output.

Optionally, the values of $t_{m1}$ for first clock signals provided to different groups of the M number of groups gradually increase group-by-group.

Optionally, a value of $t_{m1}$ for first clock signals provided to a m-th group of the M number of groups is less than a value of $t_{m1}$ for first clock signals provided to a (m+1)-th group of the M number of groups; and values of $t_{m1}$ for first clock signals provided to a same group of the M number of groups are the same.

Optionally, with respect to N number of first reference periods, a difference between a starting point of a first level component of an n-th first clock signal and a starting point of an n-th first reference period of the N number of first reference periods is equal to $t_{mA}$; durations of the N number of first reference periods are the same; an N-th first reference period of the N number of first reference periods overlaps with an N-th period of the N number of first clock signals; at least a first period of the N number of first clock signals is partially non-overlapping with a $1^{st}$ first reference period of the N number of first reference periods; and values of $t_{mA}$ for first clock signals provided to different groups of the M number of groups are different.

Optionally, a value of $t_{m1}$ for first clock signals provided to a m-th group of the M number of groups is greater than a value of $t_{mA}$ for first clock signals provided to a (m+1)-th group of the M number of groups, 1≤m≤(M−1).

Optionally, values of $t_{mA}$ for first clock signals provided to a same group of the M number of groups are the same.

Optionally, the method further comprises outputting (k*N) number of output control signals from the (k*N) number of stages of the scan circuit, respectively; wherein starting points of the (k*N) number of output control signals are equi-spaced.

Optionally, duty cycles of first clock signals provided to the M number of groups are the same.

Optionally, duty cycles of first clock signals provided to the M number of groups gradually increase group-by-group.

Optionally, the method further comprises providing N number of second clock signals time-sequentially to (k*N) number of stages of the scan circuit, respectively; wherein a respective second clock signal of the N number of second clock signals comprises a third level component and a fourth level component following the third level component; a m-th group of the M number of groups is configured to receive second clock signals before a (m+1)-th group of the M number of groups receives second clock signals; with respect to the N number of data enabling signals, a difference between a starting point of a first level component of an n-th second clock signal and a starting point of the n-th data enabling signal of the N number of data enabling signals is equal to $t_{m2}$; and values of $t_{m2}$ for second clock signals provided to different groups of the M number of groups are different.

Optionally, values of $t_{m2}$ for second clock signals provided to different groups of the M number of groups gradually increase group-by-group.

Optionally, a value of $t_{m2}$ for second clock signals provided to a m-th group of the M number of groups is less than a value of $t_{m2}$ for second clock signals provided to a (m+1)-th group of the M number of groups; and values of $t_{m2}$ for second clock signals provided to a same group of the M number of groups are the same.

Optionally, with respect to N number of second reference periods, a difference between a starting point of a third level component of an n-th second clock signal and a starting point of an n-th second reference period of the N number of second reference periods is equal to $t_{mB}$; durations of the N number of second reference periods are the same; an N-th second reference period of the N number of second reference periods overlaps with an N-th period of the N number of second clock signals; at least a first period of the N number of second clock signals is partially non-overlapping with a $1^{st}$ second reference period of the N number of second reference periods; and values of $t_{mB}$ for second clock signals provided to different groups of the M number of groups are different.

Optionally, a value of $t_{mB}$ for second clock signals provided to a m-th group of the M number of groups is greater than a value of $t_{m2}$ for second clock signals provided to a (m+1)-th group of the M number of groups, 1≤m≤(M−1).

Optionally, values of $t_{mB}$ for second clock signals provided to a same group of the M number of groups are the same.

Optionally, the method further comprises providing an integrated circuit; wherein a (m+1)-th group of the M number of groups is closer to the integrated circuit than a m-th group of the M number of groups, 1≤m≤(M−1).

Optionally, the method further comprises providing a first clock signal line; and providing a modulation circuit configured to convert original first clock signals transmitted by the first clock signal line into N number of first clock signals time-sequentially provided to the (k*N) number of stages, respectively; wherein the modulation circuit comprises a first transistor; a first resistance; a second resistance; a first capacitor; and a triode; wherein a first electrode of the first transistor is coupled to the first clock signal line and a first terminal of the first resistance; a second electrode of the first transistor is coupled to the triode; a second terminal of the first resistance is coupled to a first electrode of the first capacitor and a first terminal of the second resistance; a gate electrode of the first transistor is coupled to a second terminal of the second resistance; and an output terminal of the triode is coupled to the (k*N) number of stages; wherein the method further comprises providing, through the modulation circuit, N number of first clock signals time-sequentially to the (k*N) number of stages, respectively; wherein the method further comprises gradually increasing a resistance value of the first resistance thereby gradually increasing values of $t_{m1}$ for first clock signals provided to the M number of groups group-by-group.

In another aspect, the present disclosure provides a scan circuit, comprising (k*N) number of stages; a first clock signal line; and a modulation circuit configured to convert original first clock signals transmitted by the first clock signal line into N number of first clock signals time-sequentially provided to the (k*N) number of stages, respectively; wherein the (k*N) number of stages comprising M number of groups, a respective group of the M number of groups comprising one or more stages of the scan circuit, N, k, M being integers; N≥2, k≥1; M≥2; a respective first clock signal of the N number of first clock signals comprises a first level component and a second level component following the first level component; a m-th group of the M number of groups is configured to receive first clock signals before a (m+1)-th group of the M number of groups receives first clock signals, 1≤m≤(M−1); with respect to N number of data enabling signals, a difference between a starting point of a first level component of an n-th first clock signal and a starting point of an n-th data enabling signal of the N number of data enabling signals is equal to $t_{m1}$; values of $t_{m1}$ for first clock signals provided to different groups of the M number of groups are different; and the N number of data enabling signals are signals provided to a timing controller coupled to the scan circuit, and configured to control a timing of data output.

Optionally, the modulation circuit comprises a first transistor; a first resistance; a second resistance; a first capacitor; and a triode; wherein a first electrode of the first transistor is coupled to the first clock signal line and a first terminal of the first resistance; a second electrode of the first transistor is coupled to the triode; a second terminal of the first resistance is coupled to a first electrode of the first capacitor and a first terminal of the second resistance; a gate electrode of the first transistor is coupled to a second terminal of the second resistance; and an output terminal of the triode is coupled to the (k*N) number of stages.

Optionally, the scan circuit further comprises a second clock signal line; wherein the modulation circuit is further configured to configured to convert original second clock signals transmitted by the second clock signal line into N number of second clock signals time-sequentially provided to the (k*N) number of stages, respectively; a respective second clock signal of the N number of second clock signals comprises a third level component and a fourth level component following the third level component; a m-th group of the M number of groups is configured to receive second clock signals before a (m+1)-th group of the M number of groups receives second clock signals; with respect to the N number of data enabling signals, a difference between a starting point of a first level component of an n-th second clock signal and a starting point of the n-th data enabling signal of the N number of data enabling signals is equal to $t_{m2}$; and values of $t_{m2}$ for second clock signals provided to different groups of the M number of groups are different.

Optionally, the modulation circuit comprises a first transistor; a first resistance; a second resistance; a first capacitor; a second transistor; a third resistance; a fourth resistance; a second capacitor; and a triode; wherein a first electrode of the first transistor is coupled to the first clock signal line and a first terminal of the first resistance; a second electrode of the first transistor is coupled to the triode; a second terminal of the first resistance is coupled to a first electrode of the first capacitor and a first terminal of the second resistance; a gate electrode of the first transistor is coupled to a second terminal of the second resistance; a first electrode of the second transistor is coupled to the second clock signal line and a first terminal of the third resistance; a second electrode of the second transistor is coupled to the triode; a second terminal of the third resistance is coupled to a first electrode of the second capacitor and a first terminal of the fourth resistance; a gate electrode of the second transistor is coupled to a second terminal of the fourth resistance; and an output terminal of the triode is coupled to the (k*N) number of stages.

In another aspect, the present disclosure provides a display apparatus, comprising the scan circuit described herein or fabricated by a method described herein, and an integrated circuit connected to the first clock signal line.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Due to the presence of resistance and parasitic capacitance in signal lines, resistance-capacitance delay occurs in a display panel. The resistance-capacitance delay is particularly prominent when the signal transmitting distance in the signal lines becomes longer. The inventors of the present disclosure discover that control signals (e.g., gate scanning signals) output from a scan circuit to rows of subpixels distal to an integrated circuit have longer delays as compared to control signals output to rows of subpixels closer to the integrated circuit. The inventors of the present disclosure discover that this is at least partially due to the resistance-capacitance delay in signal lines transmitting signals (e.g., clock signals) from the integrated circuit to stages of the scan circuit.

Figure 1:
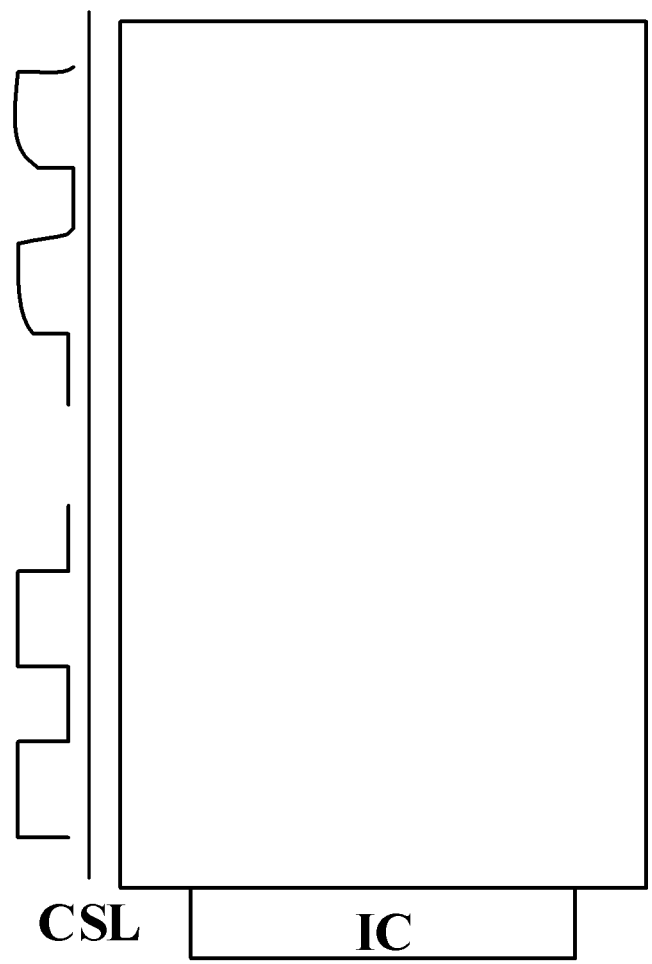
FIG. 1 is a schematic diagram illustrating resistance-capacitance delay in a clock signal line in a related scan circuit.

FIG. 1 is a schematic diagram illustrating resistance-capacitance delay in a clock signal line in a related scan circuit. Referring to FIG. 1, a waveform of the clock signals transmitted by the clock signal line CSL is depicted on the left side of FIG. 1. The clock signal line CSL is connected to an integrated circuit IC. A clock signal transmitted to stages of the scan circuit closer to the integrated circuit IC has minimal or no resistance-capacitance delay. As the transmitting distance increases, clock signals transmitted to stages of the scan circuit more distal to the integrated circuit IC have greater resistance-capacitance delay.

Figure 2:
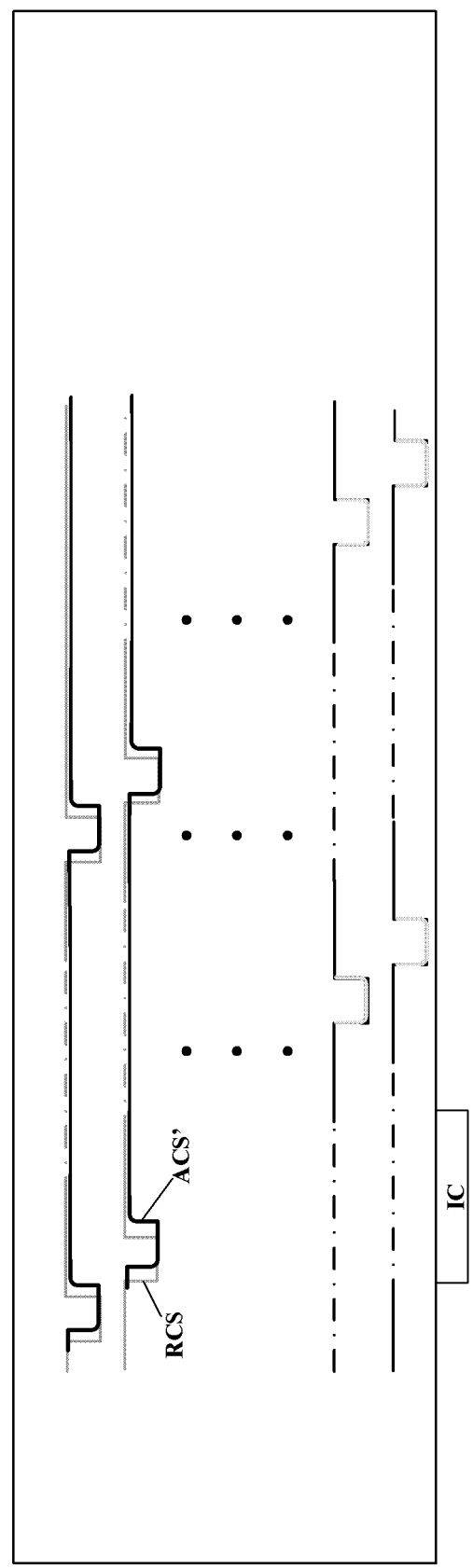
FIG. 2 is a schematic diagram illustrating delays of control signals in a related scan circuit.

FIG. 2 is a schematic diagram illustrating delays of control signals in a related scan circuit. Referring to FIG. 2, actual control signals ACS' and reference control signals RCS are shown. Actual control signals ACS' denote control signals that are actually generated with delays at least partially due to the resistance-capacitance delay in the clock signal line CSL. Reference control signals RCS denote hypothetical control signals without delays. For control signals output to rows of subpixels closer to the integrated circuit IC, minimal or no delay is observed, as the waveforms of the actual control signals ACS' and the reference control signals RCS are nearly overlapping with each other. For control signals output to rows of subpixels distal to the integrated circuit IC, a more severe delay is observed, as the waveforms of the actual control signals ACS' and the reference control signals RCS are partially non-overlapping with each other.

Figure 3A:
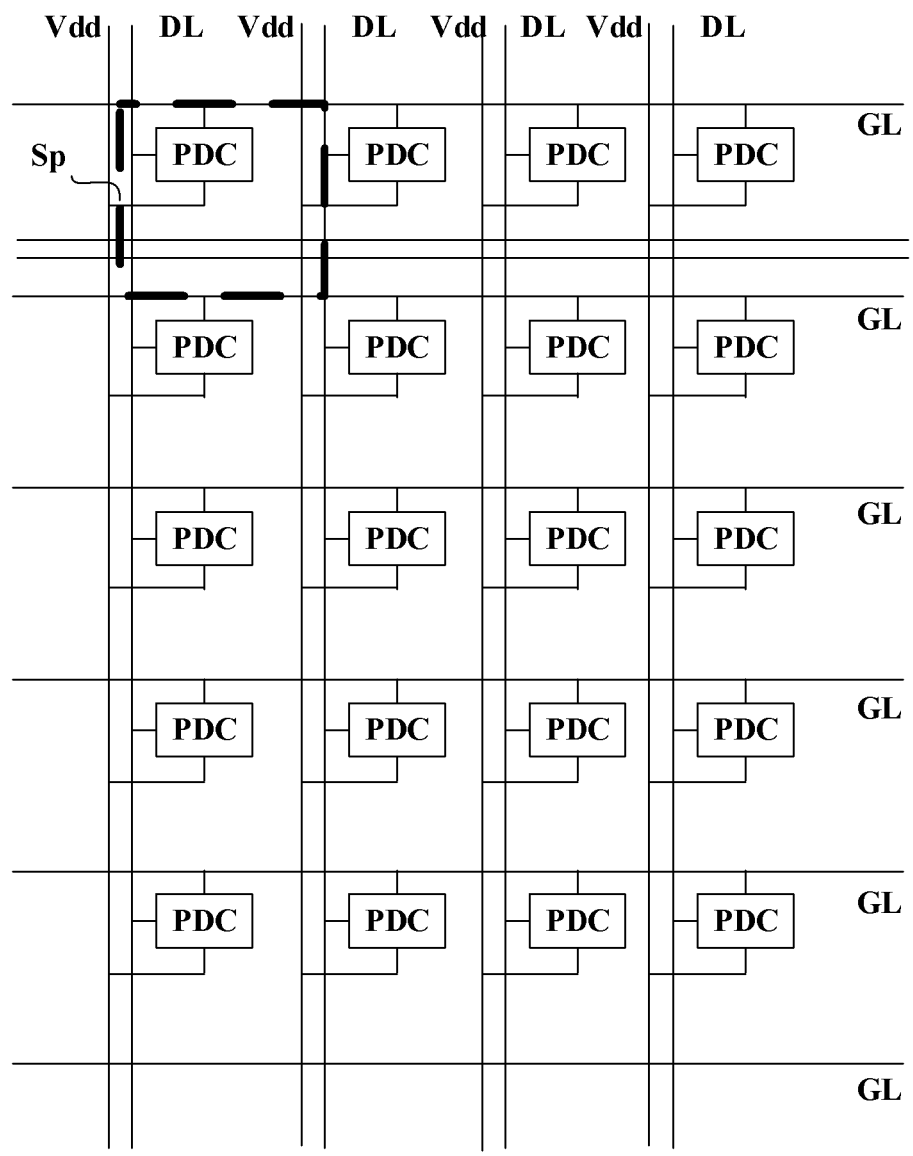
FIG. 3A is a plan view of a display panel in some embodiments according to the present disclosure.

The scan circuit in some embodiments is configured to provide control signals to rows of subpixels in a display panel. Examples of control signals include gate scanning signals, reset control signals, and light emitting control signals. In one example, the control signals are output to pixel driving circuits of a light emitting diode display panel. FIG. 3A is a plan view of a display panel in some embodiments according to the present disclosure. Referring to FIG. 3A, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of high voltage signal lines Vdd. Light emission in a respective subpixel is driven by a respective pixel driving circuit PDC. In one example, a high voltage signal is input, through a respective one of the plurality of high voltage signal lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage ΔV that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 3B:
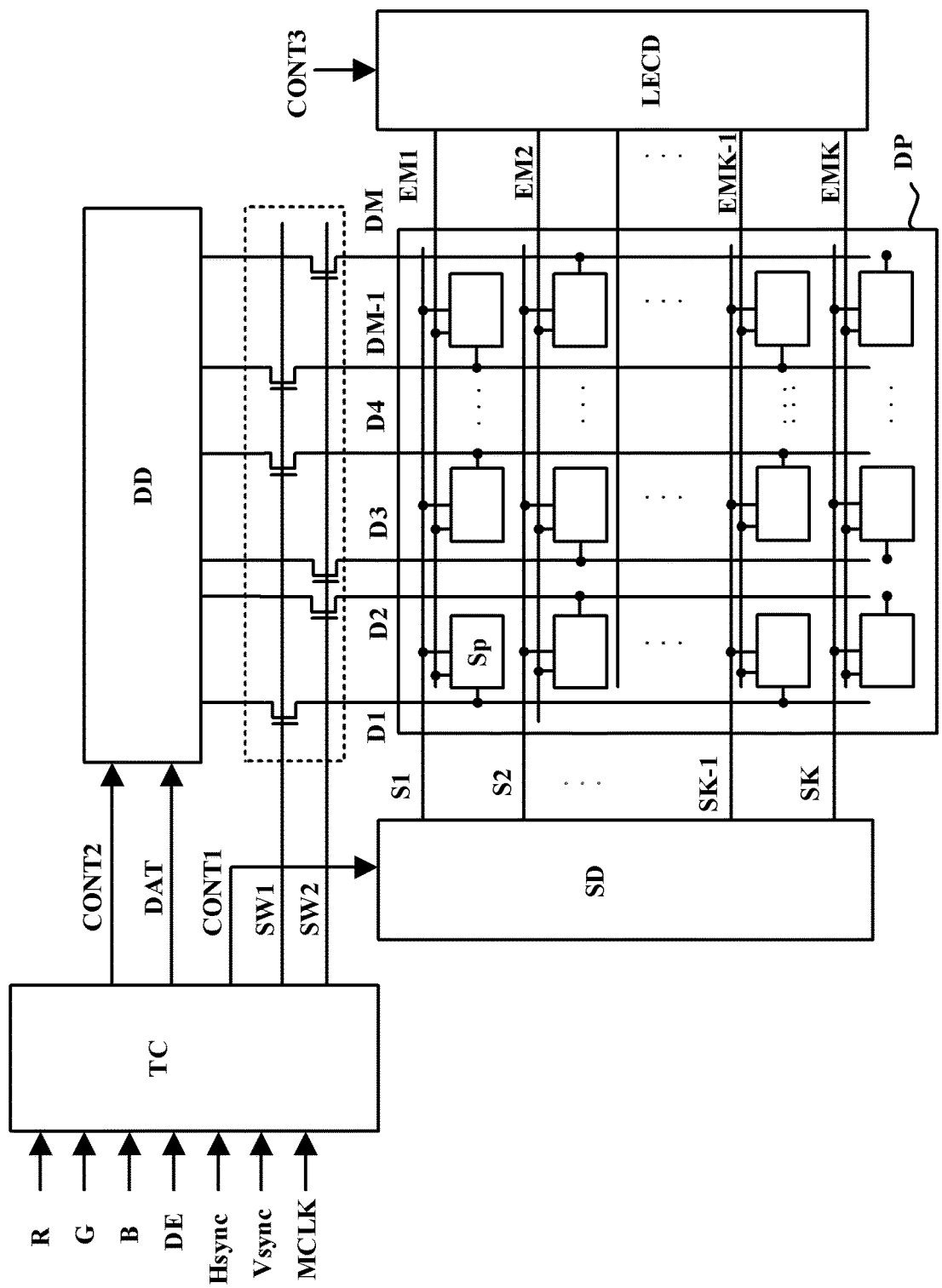
FIG. 3B is a schematic diagram of a display apparatus in some embodiments according to the present disclosure.

FIG. 3B is a schematic diagram of a display apparatus in some embodiments according to the present disclosure. Referring to FIG. 3B, the display apparatus includes a timing controller TC, a scanning driver SD, a data driver DD, a light-emitting control driver LECD, and a display panel DP. The timing controller TC receives synchronization signals and video signals R, G, and B from a system interface. The synchronization signals may include, for example, a horizontal synchronization signal Hsync, a vertical synchronization signal Vsync, a main clock signal MCLK, and a data enabling signal DE. The video signals R, G, and B comprise luminance information of each of a plurality of sub-pixels PX. The data enabling signal DE is configured to control a timing of data output by a data line.

The timing controller TC generates a first driving control signal CONT1, a second driving control signal CONT2, a third driving control signal CONT3, a first switch control signal SW1, a second switch control signal SW2, and a digital image signal DAT according to the video signals R, G, and B, the horizontal synchronization signal Hsync, the vertical synchronization signal Vsync, the data enabling signal DE, and the main clock signal MCLK. The timing controller TC also divides the video signals R, G, and B in units of frames according to the vertical synchronization signal Vsync, and divides the video signals R, G, and B in units of data lines according to the horizontal synchronization signal Hsync, to generate a digital image signal DAT. The timing controller TC transmits the digital image signal DAT and the second driving control signal CONT2 to the data driver DD.

The timing controller TC may be implemented in various appropriate ways (for example, using dedicated hardware), to perform various functions discussed herein. A "processor" is an example of the timing controller which uses one or more microprocessors that may be programmed using software (for example, microcodes) to perform the various functions discussed herein. The timing controller TC may be implemented with or without a processor, and may also be implemented as a combination of dedicated hardware which performs some functions and a processor which performs other functions (for example, one or more programmed microprocessors and associated circuits). Examples of controller components which may be used in various embodiments of the present disclosure comprise, but not limited to, conventional microprocessors, Application Specific Integrated Circuits (ASICs), and Field Programmable Gate Arrays (FPGAs).

As shown in FIG. 3B, the display panel DP in some embodiments includes a plurality of subpixels Sp which are arranged substantially in a matrix form. In the present embodiment, the plurality of subpixels Sp may include light emitting elements such as organic light emitting diodes and associated pixel driving circuits.

In the display panel DP, a plurality of scanning lines S1, S2, ..., SK−1, and SK which are substantially parallel extend in a row direction, a plurality of light-emitting control lines EM1, EM2, ..., EMK−1, EMK which are substantially parallel extend in the row direction, and a plurality of data lines D1, D2, D3, D4 ..., DM−1, DM which are substantially parallel extend in a column direction. The scanning lines S1 to SK, the light-emitting control lines EM1 to EMK, and the data lines D1 to DM are coupled to the plurality of subpixels Sp. When a light-emitting control signal on a light-emitting control line is valid, a row of subpixels connected to the light-emitting control line is enabled to emit light.

The scanning driver SD is coupled to the scanning lines S1 to SK, and generates a plurality of scanning signals according to the first driving control signal CONT1. The scanning driver SD may sequentially apply a scanning signal to the scanning lines S1 to SK. In some embodiments, the scanning driver SD may be integrated as a Gate Driver On Array (GOA) with the display panel DP.

The light-emitting control driver LECD is coupled to the light-emitting control lines EM1 to EMK, and generates a plurality of light-emitting control signals according to the third driving control signal CONT3. The light-emitting control driver LECD may sequentially apply a light-emitting control signal to the light-emitting control lines EM1 to EMK. In some embodiments, the light-emitting control driver LECD may be integrated as a GOA with the display panel DP.

The data driver DD samples and holds the digital image signal DAT according to the second driving control signal CONT2, and generates a plurality of analog data signals from the digital image signal DAT. In some exemplary embodiments, the data driver DD may comprise a shift register, a latch, a digital-to-analog converter, and a buffer. The shift register may output a latch pulse to the latch. The latch may temporarily store and output the digital image signal DAT, and may output the digital image signal DAT to the digital-to-analog converter. The digital-to-analog converter may generate analog data signals based on the digital image signal DAT, and output the analog data signals to the buffer.

Figure 4:
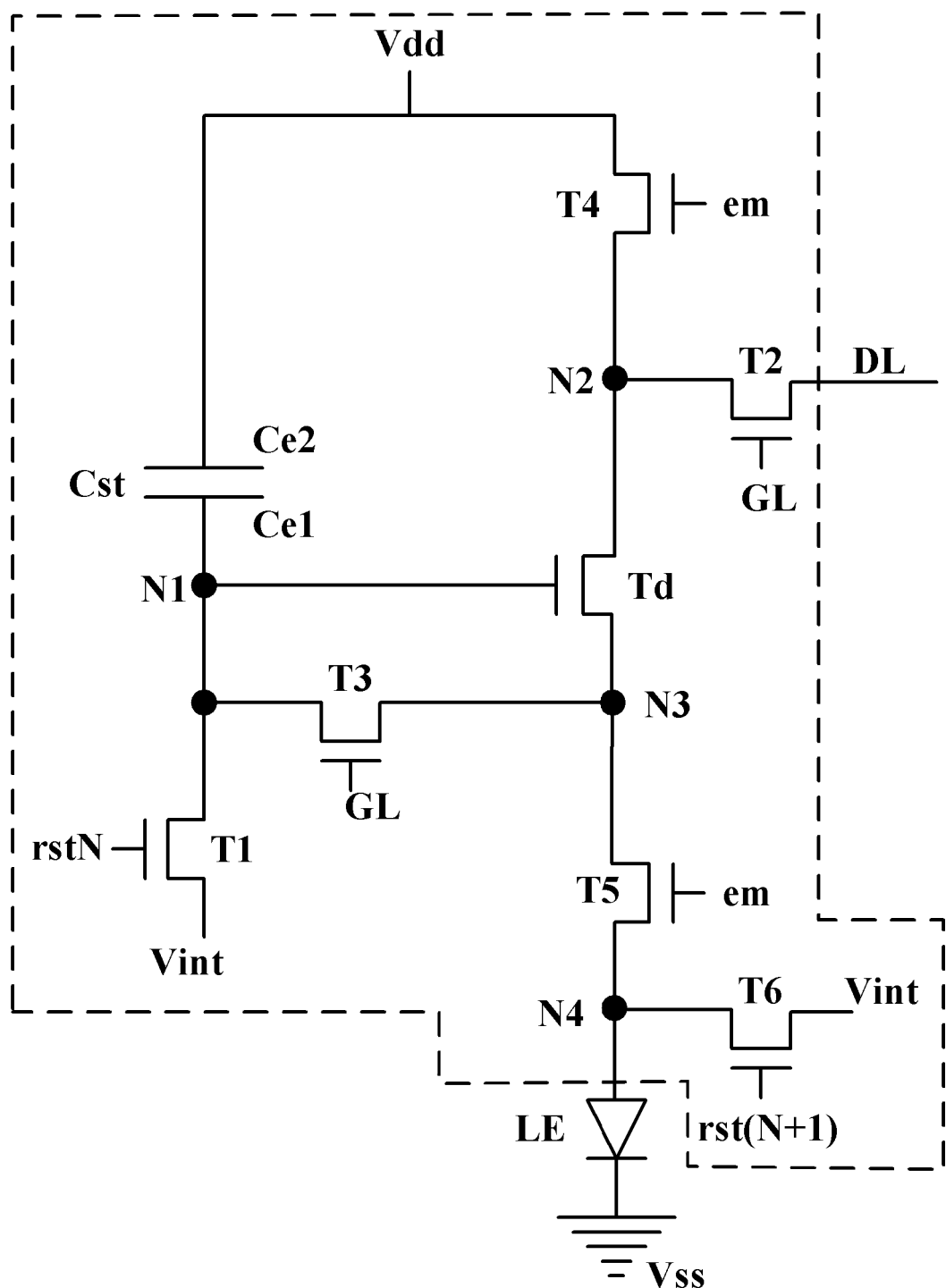
FIG. 4 is a circuit diagram illustrating the structure of a pixel driving circuit in some embodiments according to the present disclosure.

FIG. 4 is a circuit diagram illustrating the structure of a pixel driving circuit in some embodiments according to the present disclosure. Referring to FIG. 4, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage of a plurality of reset control signal lines, a source electrode connected to a respective reset signal line Vint in a present stage of a plurality of first reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a respective reset control signal line rst(N+1) in a next adjacent stage of a plurality of reset control signal lines, a source electrode connected to a respective reset signal line Vint in the present stage of the plurality of second reset signal lines, and a drain electrode connected to the drain electrode of the fifth transistor and the anode of the light emitting element LE. The second capacitor electrode Ce2 is connected to the respective voltage supply line and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

In one example, the scan circuit is a gate scanning signal scan circuit configured to provide gate scanning signals to the plurality of gate lines GL. In another example, the scan circuit is a light emitting control signal scan circuit configured to provide light emitting control signals to the plurality of light emitting control signal lines em. In another example, the scan circuit is a reset control signal scan circuit configured to provide reset control signals to the plurality of reset control signal lines (e.g., rstN and rst(N+1)).

Figure 5:
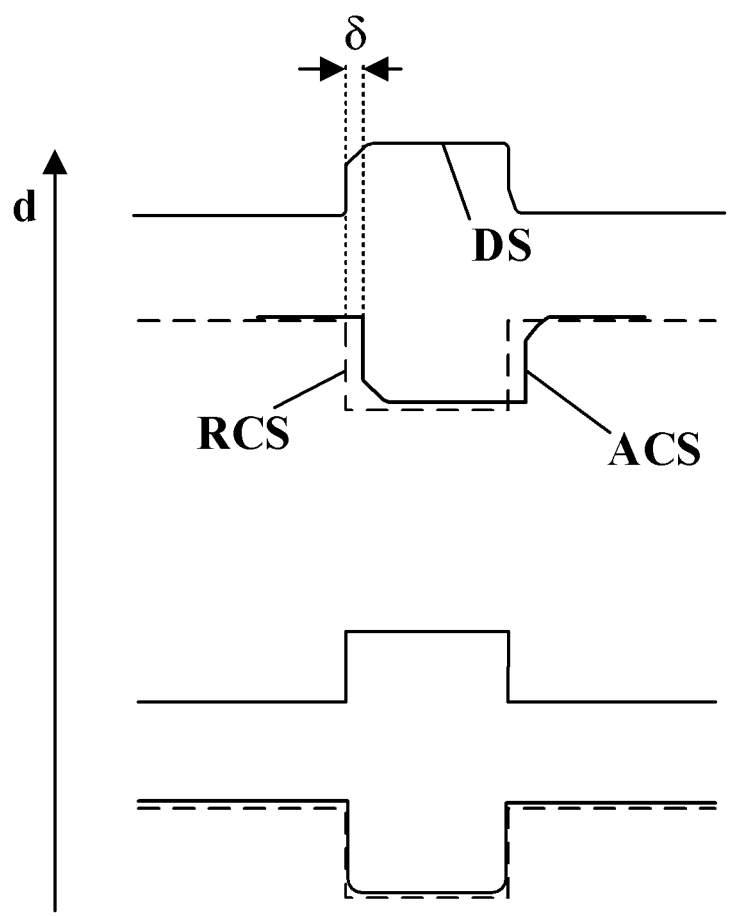
FIG. 5 illustrates reduction in data charging duration due to delays of control signals in a related scan circuit.

FIG. 5 illustrates reduction in data charging duration due to delays of control signals in a related scan circuit. Referring to FIG. 5, as the transmitting distance d increases, clock signals transmitted to stages of the scan circuit more distal to the integrated circuit have greater resistance-capacitance delay, and control signals provided to the stages of the scan circuit more distal to the integrated circuit have greater delays. The data charging duration for pixel driving circuits corresponding to subpixels more distal to the integrated circuit is reduced, e.g., by a value of 6, whereas the data charging duration for pixel driving circuits corresponding to subpixels closer to the integrated circuit is minimally or not reduced.

Figure 6:
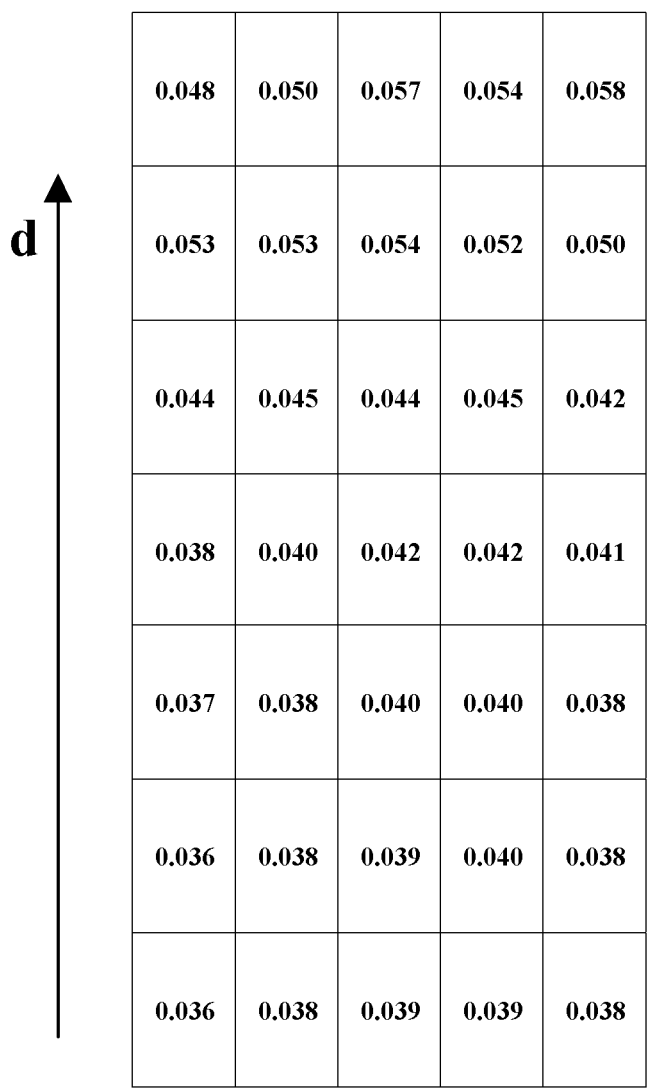
FIG. 6 shows brightness variation due to delays of control signals in a related scan circuit.

Because the data charging duration for pixel driving circuits corresponding to subpixels more distal to the integrated circuit is reduced, referring to FIG. 4, the voltage level charged to the N1 node is also reduced, leading to a reduced Vgs for the driving transistor Td and an increased driving current. The increased driving current results in an increased brightness in subpixels more distal to the integrated circuit. FIG. 6 shows brightness variation due to delays of control signals in a related scan circuit. The display panel is configured to display an image, with data signals of a same level provided to all subpixels in the display panel. The signal transmitting distance in the clock signal lines is denoted by "d". As shown in FIG. 6, display areas more distal to the integrated circuit (corresponding to a greater value of the signal transmitting distance d) have greater brightness, whereas display areas closer to the integrated circuit (corresponding to a smaller value of the signal transmitting distance d) have lower brightness.

Figure 7:
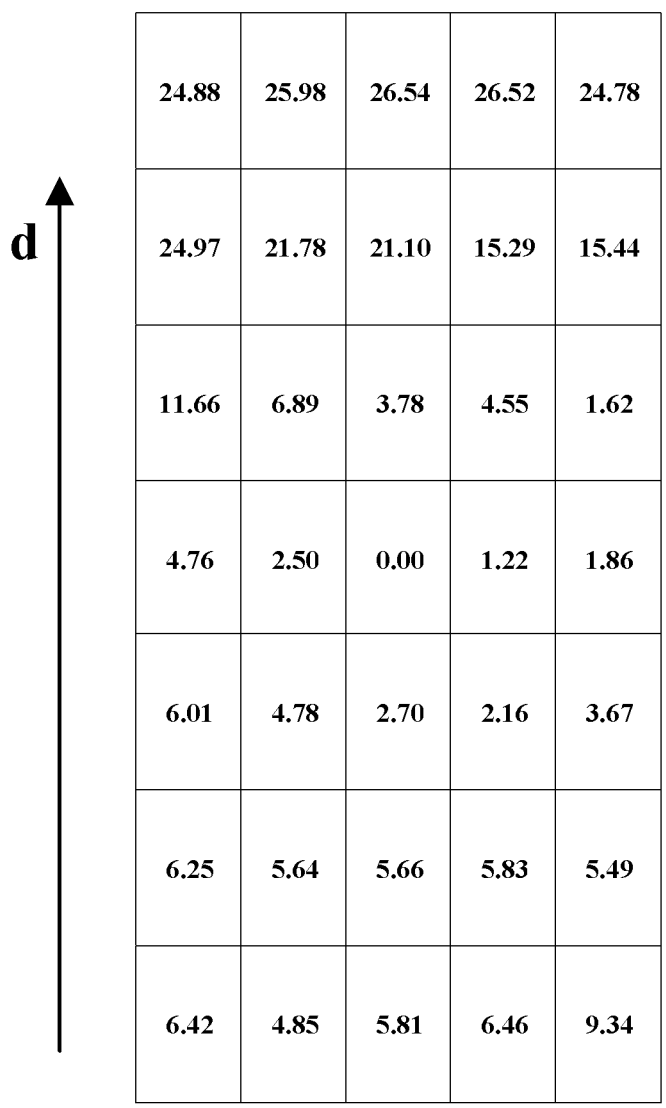
FIG. 7 shows delta E5 variation due to delays of control signals in a related scan circuit.

FIG. 7 shows delta E5 variation due to delays of control signals in a related scan circuit. The display panel is configured to display an image, with data signals of a same level provided to all subpixels in the display panel. The signal transmitting distance in the clock signal lines is denoted by "d". The delta E5 values stands for the difference between a displayed color and an original color standard for the input data signal. A lower delta E5 value denotes a greater accuracy whereas a higher delta E5 value denotes a poorer accuracy. As shown in FIG. 7, display areas more distal to the integrated circuit (corresponding to a greater value of the signal transmitting distance d) have greater delta E5 values as compared to display areas closer to the integrated circuit (corresponding to a smaller value of the signal transmitting distance d).

Figure 8:
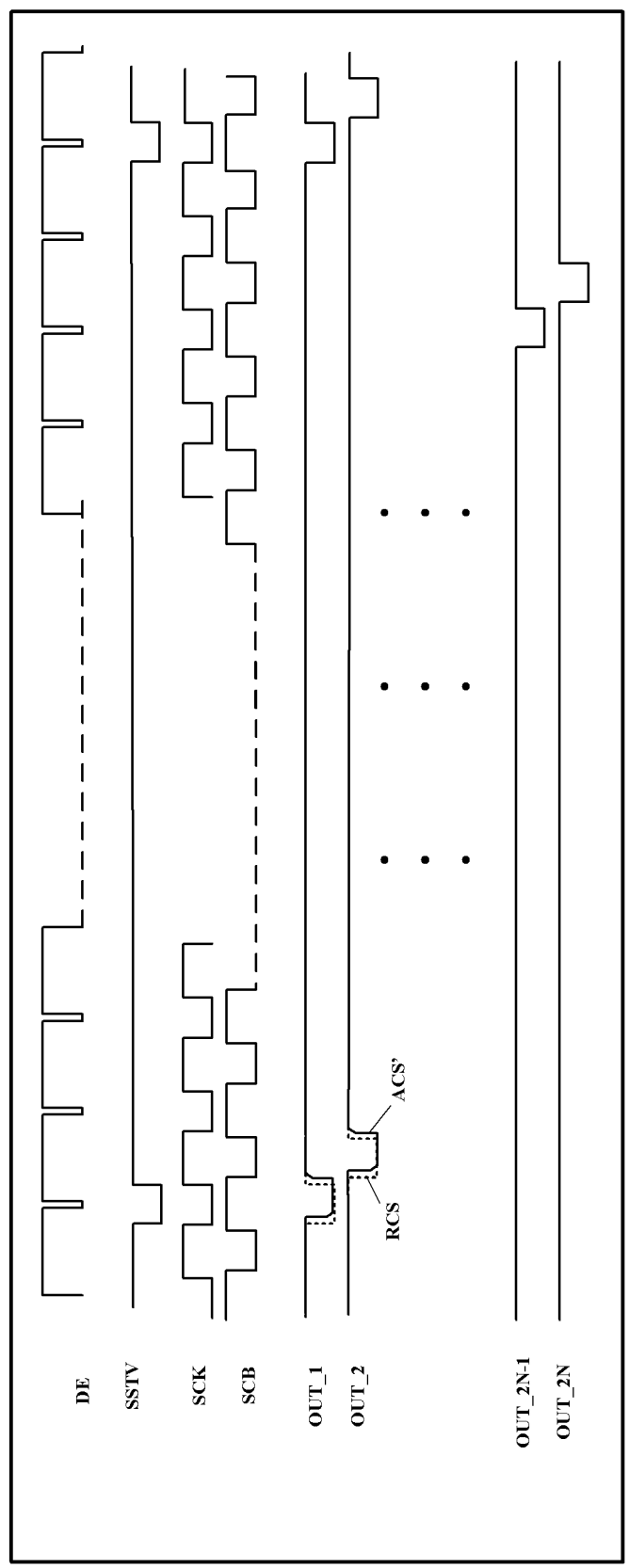
FIG. 8 is a schematic diagram illustrating delays of control signals in a related scan circuit.

FIG. 8 is a schematic diagram illustrating delays of control signals in a related scan circuit. Referring to FIG. 8, waveforms of a start signal SSTV, a data enabling signal DE, a first clock signal SCK and a second clock signal SCB are shown. The period of the data enabling signal DE is constant. Optionally, the first clock signal SCK and the second clock signal SCB each may have a cycle of two horizontal periods (2H), and have a gate-on level during different horizontal periods. Optionally, the second clock signal SCB may be set to a signal shifted by a half cycle (i.e., one horizontal period (1H)) from the first clock signal SCK. In one example, the first clock signal SCK is transmitted to stages of the scan circuit through a first clock signal line connected to an integrated circuit, the second clock signal SCB is transmitted to stages of the scan circuit through a second clock signal line connected to the integrated circuit, and the start signal SSTV is transmitted to stages of the scan circuit through a start signal line connected to the integrated circuit. Waveforms of output signals output from the stages of the scan circuit are also depicted in FIG. 8. For example, OUT_1 is an output signal output from a stage of the scan circuit most distal to the integrated circuit, OUT_2 is an output signal output from a stage of the scan circuit second most distal to the integrated circuit, OUT_N–1 is an output signal output from a stage of the scan circuit second closest to the integrated circuit, and OUT_N is an output signal output from a stage of the scan circuit closest to the integrated circuit.

In FIG. 8, actual control signals ACS' and reference control signals RCS are shown. Actual control signals ACS' denote control signals that are actually generated with delays at least partially due to the resistance-capacitance delay in the clock signal line CSL. Reference control signals RCS denote hypothetical control signals without delays. For control signals output to rows of subpixels closer to the integrated circuit (e.g., output from stages of the scan circuit closer to the integrated circuit), minimal or no delay is observed, as the waveforms of the actual control signals ACS' and the reference control signals RCS are nearly overlapping with each other. For control signals output to rows of subpixels distal to the integrated circuit (e.g., output from stages of the scan circuit distal to the integrated circuit), a more severe delay is observed, as the waveforms of the actual control signals ACS' and the reference control signals RCS are partially non-overlapping with each other.

Figure 9:
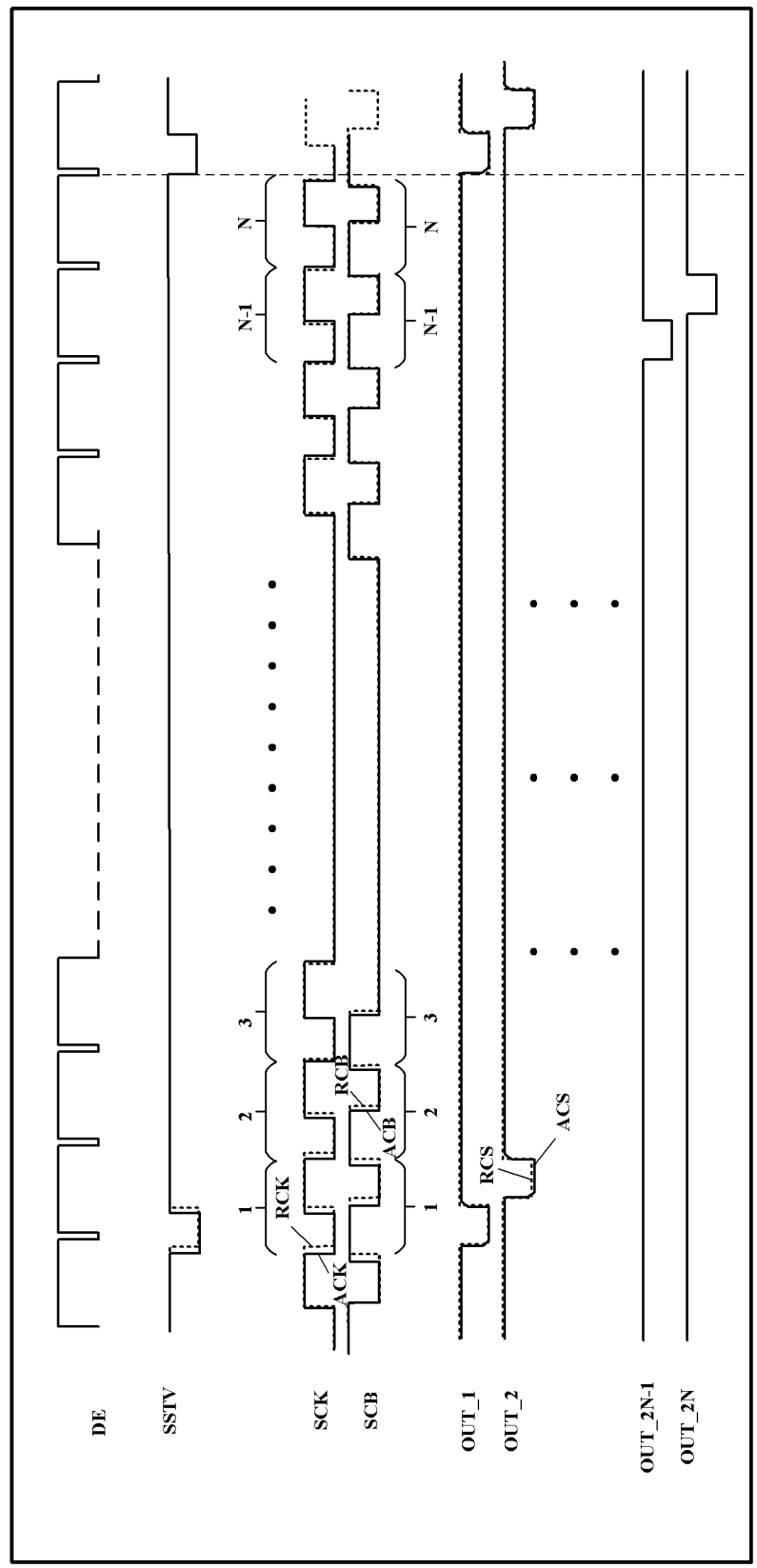
FIG. 9 is a schematic diagram illustrating a method of driving a scan circuit in some embodiments according to the present disclosure.

Accordingly, the present disclosure provides, inter alia, a method of driving a scan circuit, a scan circuit, and a display apparatus that substantially obviate one or more of the problems due to limitations and disadvantages of the related art. In one aspect, the present disclosure provides a method of driving a scan circuit. In some embodiments, the method includes providing N number of first clock signals time-sequentially to (k*N) number of stages of the scan circuit, respectively, the (k*N) number of stages comprising M number of groups, a respective group of the M number of groups comprising one or more stages of the scan circuit, N, k, M being integers; N≥2, k≥1; M≥2. Optionally, a respective first clock signal of the N number of first clock signals comprises a first level component and a second level component following the first level component. Optionally, a m-th group of the M number of groups is configured to receive first clock signals before a (m+1)-th group of the M number of groups is configured to receive first clock signals, 1≤m≤(M−1). Optionally, with respect to N number of data enabling signals, a difference between a starting point of a first level component of an n-th first clock signal and a starting point of an n-th data enabling signal of the N number of data enabling signals is equal to $t_{m1}$. Optionally, values of $t_{m1}$ for first clock signals provided to different groups of the M number of groups are different. Optionally, the N number of data enabling signals are signals provided to a timing controller coupled to the scan circuit, and configured to control a timing of data output FIG. 9 is a schematic diagram illustrating a method of driving a scan circuit in some embodiments according to the present disclosure. Referring to FIG. 9, the method includes providing N number of first clock signals SCK time-sequentially to (k*N) number of stages of the scan circuit, respectively. Optionally, N is an integer ≥2. Optionally, k is an integer ≥1 (e.g., 1, 2, 3, 4, 5, or 6). In one example as shown in FIG. 9, k=2.

Referring to FIG. 9, the method in some embodiments further includes providing N number of second clock signals SCB time-sequentially to (k*N) number of stages of the scan circuit, respectively. Optionally, N is an integer ≥2. Optionally, k is an integer ≥1 (e.g., 1, 2, 3, 4, 5, or 6). In one example as shown in FIG. 9, k=2.

Figure 10:
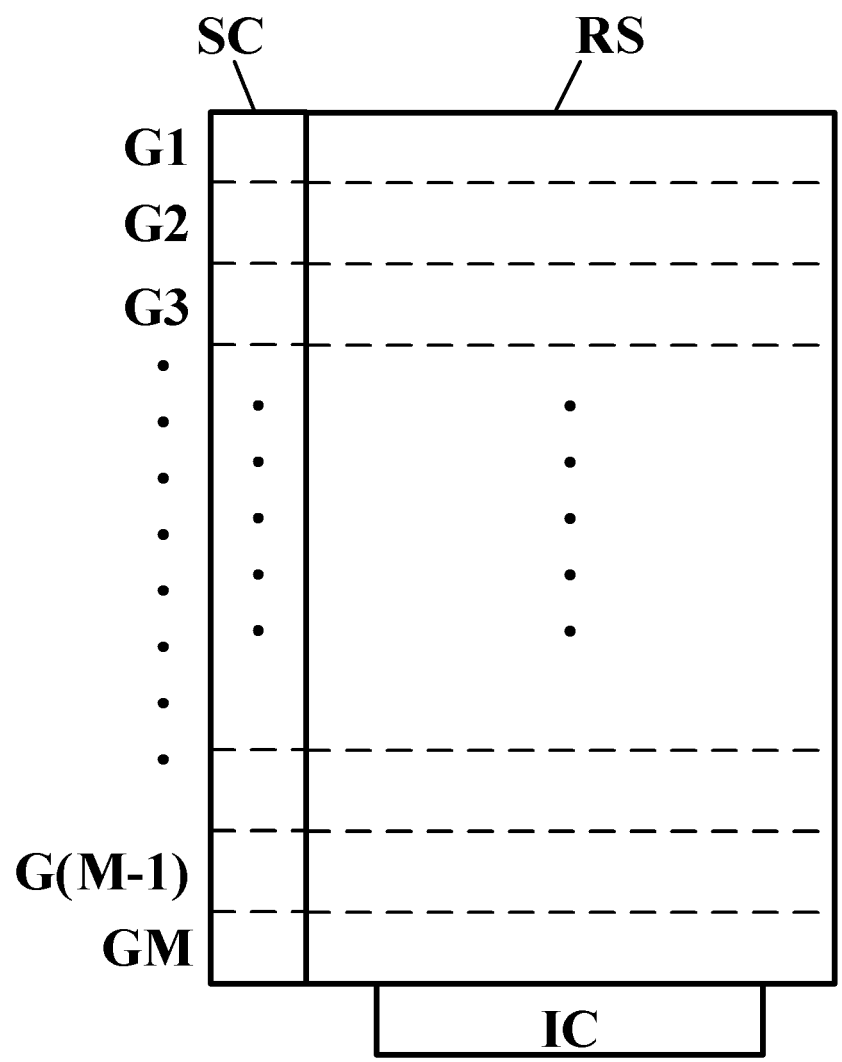
FIG. 10 is a schematic diagram illustrating M number of groups of stages of a scan circuit in some embodiments according to the present disclosure.

In some embodiments, the (k*N) number of stages include M number of groups. A respective group of the M number of groups includes one or more stages of the scan circuit. Optionally, M is an integer ≥2. FIG. 10 is a schematic diagram illustrating M number of groups of stages of a scan circuit in some embodiments according to the present disclosure. Referring to FIG. 10, the stages of the scan circuit may be grouped into M number of groups, including G1, G2, G3, . . . , G(M−1), and GM. Correspondingly, rows of subpixels RS in the display area may also be grouped into M number of groups of rows of subpixels, as depicted in FIG. 10. In one example, a respective group of the M number of groups of stages includes a single stage of the scan circuit. In another example, a respective group of the rows of subpixels includes a single row of subpixels. In another example, a respective group of the M number of groups of stages includes multiple stages of the scan circuit. In another example, a respective group of the rows of subpixels includes multiple rows of subpixels. In one example, M=16. In another example, M is a multiple of 16.

In some embodiments, a (m+1)-th group of the M number of groups is closer to the integrated circuit than a m-th group of the M number of groups, 1≤m≤(M−1). In one example, the first group of the M number of groups is the first group, time-sequentially, receiving the clock signals, the M-th group is the last group, time-sequentially, receiving the clock signals; and the m-th group of the M number of groups receives the clock signals before the (m+1)-th group of the M number of groups receives the clock signals. In another example, the M-th group of the M number of groups is the first group, time-sequentially, receiving the clock signals, the first group of the M number of groups is the last group, time-sequentially, receiving the clock signals; and the (m+1)-th group of the M number of groups receives the clock signals before the m-th group of the M number of groups receives the clock signals.

Referring to FIG. 9, N number of actual first clock signals generated according to the present method are denoted as ACK, N number of data enabling signals DE are also denoted. The N number of data enabling signals DE may be understood as repeating clock signals, each of which has a same duration. As shown in FIG. 9, at least some of N number of actual first clock signals ACK are generated with phase shifts with respect to corresponding ones of the N number of data enabling signal DE.

Referring to FIG. 9, N number of actual second clock signals generated according to the present method are denoted as ACB, N number of data enabling signals DE are denoted. The N number of data enabling signals DE may be understood as repeating clock signals, each of which has a same duration. As shown in FIG. 9, at least some of N number of actual second clock signals ACB are generated with phase shifts with respect to corresponding ones of the N number of data enabling signals DE.

Referring to FIG. 9, N number of actual first clock signals generated according to the present method are denoted as ACK, N number of first reference clock signals are denoted as RCK. The N number of first reference clock signals RCK may be understood as repeating clock signals, each of which has a same period. As shown in FIG. 9, at least some of N number of actual first clock signals ACK are generated with phase shifts with respect to corresponding ones of the N number of first reference clock signals RCK. Optionally, at least some of the N number of actual first clock signals ACK have a same period. In one example, the N number of actual first clock signals ACK have a same period. In some embodiments, at least an N-th (e.g., a last one) actual first clock signal of the N number of actual first clock signals ACK completely overlaps with an N-th (e.g., a last one) first reference clock signal of the N number of first reference clock signals RCK. In some embodiments, at least a first actual first clock signal of the N number of actual first clock signals ACK is partially non-overlapping with a $1^{st}$ first reference clock signal of the N number of first reference clock signals RCK.

Referring to FIG. 9, N number of actual second clock signals generated according to the present method are denoted as ACB, N number of second reference clock signals are denoted as RCB. The N number of second reference clock signals RCB may be understood as repeating clock signals, each of which has a same period. As shown in FIG. 9, at least some of N number of actual second clock signals ACB are generated with phase shifts with respect to corresponding ones of the N number of second reference clock signals RCB. Optionally, at least some of the N number of actual second clock signals ACB have a same period. In one example, the N number of actual second clock signals ACB have a same period. In some embodiments, at least an N-th (e.g., a last one) actual second clock signal of the N number of actual second clock signals ACB completely overlaps with an N-th (e.g., a last one) second reference clock signal of the N number of second reference clock signals RCB. In some embodiments, at least a first actual second clock signal of the N number of actual second clock signals ACB is partially non-overlapping with a $1^{st}$ second reference clock signal of the N number of second reference clock signals RCB.

Referring to FIG. 9, actual control signals ACS and reference control signals RCS are shown. Actual control signals ACS denote control signals that are actually generated with clock signals modulated with phase shifts based on the method according to the present disclosure. Reference control signals RCS denote hypothetical control signals without delays, for example, without delays at least partially due to the resistance-capacitance delay in the clock signal lines. As shown in FIG. 9, the actual control signals ACS and the reference control signals RCS are substantially overlapping with each other. For example, the actual control signals ACS and the reference control signals RCS deviate from each other by less than 10%, e.g., by less than 9%, by less than 8%, by less than 7%, by less than 6%, by less than 5%, by less than 4%, by less than 3%, by less than 2%, by less than 1%, by less than 0.5%, by less than 0.4%, by less than 0.3%, by less than 0.2%, by less than 0.1%. In one example, the actual control signals ACS and the reference control signals RCS are completely overlapping with each other.

As compared to the driving method depicted in FIG. 8, the driving method depicted in FIG. 9 obviates the issue of control signal delay. As shown in FIG. 9, for control signals output to rows of subpixels distal to the integrated circuit IC, minimal or no delay is observed, as the waveforms of the actual control signals ACS and the reference control signals RCS are nearly overlapping with each other. For control signals output to rows of subpixels closer to the integrated circuit IC, minimal or no delay is observed, as the waveforms of the actual control signals ACS and the reference control signals RCS are nearly overlapping with each other. Throughout an entirety of the display panel, minimal or no delay is observed in control signals output to any row or any group of rows of subpixels, regardless of the signal transmitting distance in the clock signal lines, or regardless of proximity to the integrated circuit.

In some embodiments, the method further includes outputting (k*N) number of output control signals from the (k*N) number of stages of the scan circuit, respectively. Optionally, starting points of the (k*N) number of output control signals are equi-spaced, e.g., deviation from each other by less than 10%, e.g., by less than 9%, by less than 8%, by less than 7%, by less than 6%, by less than 5%, by less than 4%, by less than 3%, by less than 2%, by less than 1%, by less than 0.5%, by less than 0.4%, by less than 0.3%, by less than 0.2%, by less than 0.1%.

As a result, a substantially uniform (e.g., deviation from each other by less than 10%, e.g., by less than 9%, by less than 8%, by less than 7%, by less than 6%, by less than 5%, by less than 4%, by less than 3%, by less than 2%, by less than 1%, by less than 0.5%, by less than 0.4%, by less than 0.3%, by less than 0.2%, by less than 0.1%) data charging duration for pixel driving circuits corresponding to all subpixels or all groups of rows of subpixels throughout the entirety of the display panel can be achieved. A substantially uniform (e.g., deviation from each other by less than 10%, e.g., by less than 9%, by less than 8%, by less than 7%, by less than 6%, by less than 5%, by less than 4%, by less than 3%, by less than 2%, by less than 1%, by less than 0.5%, by less than 0.4%, by less than 0.3%, by less than 0.2%, by less than 0.1%) brightness throughout the entirety of the display panel can be achieved when data signals of a same level provided to all subpixels in the display panel. A substantially uniform (e.g., deviation from each other by less than 10%, e.g., by less than 9%, by less than 8%, by less than 7%, by less than 6%, by less than 5%, by less than 4%, by less than 3%, by less than 2%, by less than 1%, by less than 0.5%, by less than 0.4%, by less than 0.3%, by less than 0.2%, by less than 0.1%) delta E5 value throughout the entirety of the display panel can be achieved when data signals of a same level provided to all subpixels in the display panel.

Figure 11:
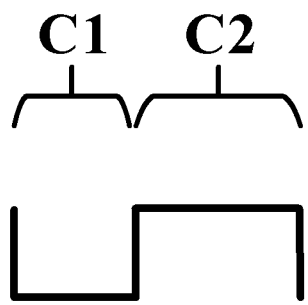
FIG. 11 depicts a waveform of a respective first clock signal of N number of first clock signals in some embodiments according to the present disclosure.

FIG. 11 depicts a waveform of a respective first clock signal of N number of first clock signals in some embodiments according to the present disclosure. Referring to FIG. 11, the respective first clock signal of N number of first clock signals in some embodiments includes a first level component C1 and a second level component C2 following the first level component C1. In one example, the first level component C1 is a low voltage level component, and the second level component C2 is a high voltage level component. In another example, the first level component C1 is a high voltage level component, and the second level component C2 is a low voltage level component.

Figure 12:
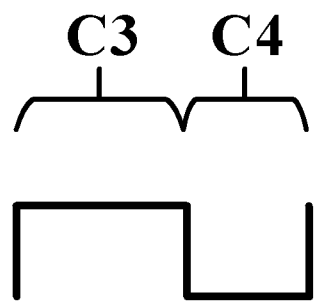
FIG. 12 depicts a waveform of a respective second clock signal of N number of second clock signals in some embodiments according to the present disclosure.

FIG. 12 depicts a waveform of a respective second clock signal of N number of second clock signals in some embodiments according to the present disclosure. Referring to FIG. 12, the respective second clock signal of N number of second clock signals in some embodiments includes a third level component C3 and a fourth level component C4 following the third level component C3. In one example, the third level component C3 is a high voltage level component, and the fourth level component C4 is a low voltage level component. In another example, the third level component C3 is a low voltage level component, and the fourth level component C4 is a high voltage level component.

Figure 13:
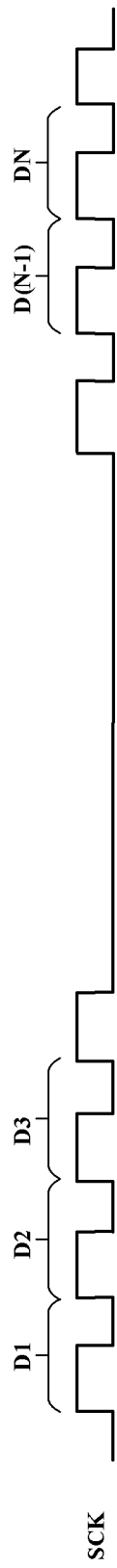
FIG. 13 depicts periods of N number of first clock signals in some embodiments according to the present disclosure.

FIG. 13 depicts periods of N number of first clock signals in some embodiments according to the present disclosure. Referring to FIG. 13, periods of the N number of first clock signals SCK provided to the M number of groups, including D1, D2, D3, . . . , D(N−1), DN, are the same.

Figure 14:
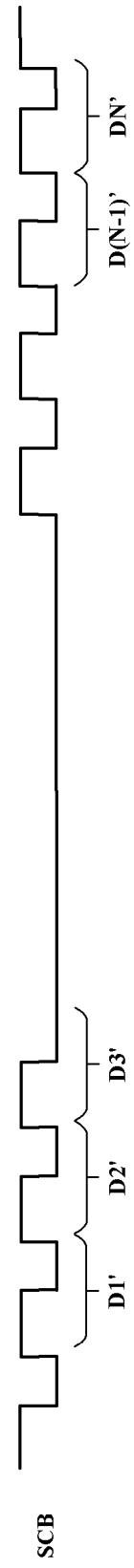
FIG. 14 depicts periods of N number of second clock signals in some embodiments according to the present disclosure.

FIG. 14 depicts periods of N number of second clock signals in some embodiments according to the present disclosure. Referring to FIG. 14, periods of the N number of second clock signals SCB provided to the M number of groups, including D1', D2', D3', . . . , D(N−1)', DN', are the same.

Figure 15:
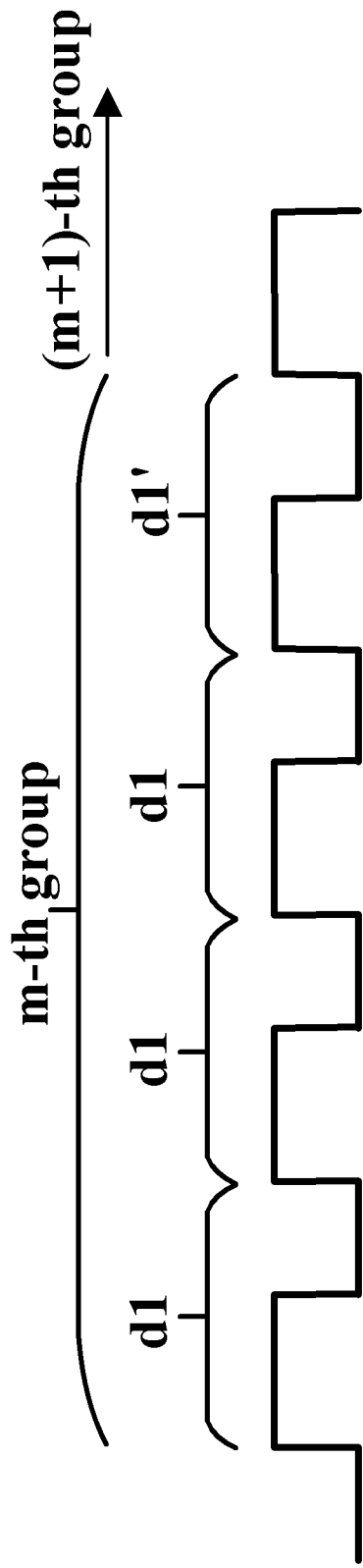
FIG. 15 depicts periods of first clock signals provided to a m-th group of M number of groups in some embodiments according to the present disclosure.

FIG. 15 depicts periods of first clock signals provided to a m-th group of M number of groups in some embodiments according to the present disclosure. Referring to FIG. 15, the first clock signals provided to a m-th group of M number of groups, except for a first clock signal provided to a stage immediately adjacent to a (m+1)-th group of the M number of groups, have a same period d1. The first clock signal provided to a stage immediately adjacent to a (m+1)-th group of the M number of groups has a period d1'. Optionally, d1 and d1' are different from each other. In one example, d1'>d1. In another example, d1'<d1.

Figure 16:
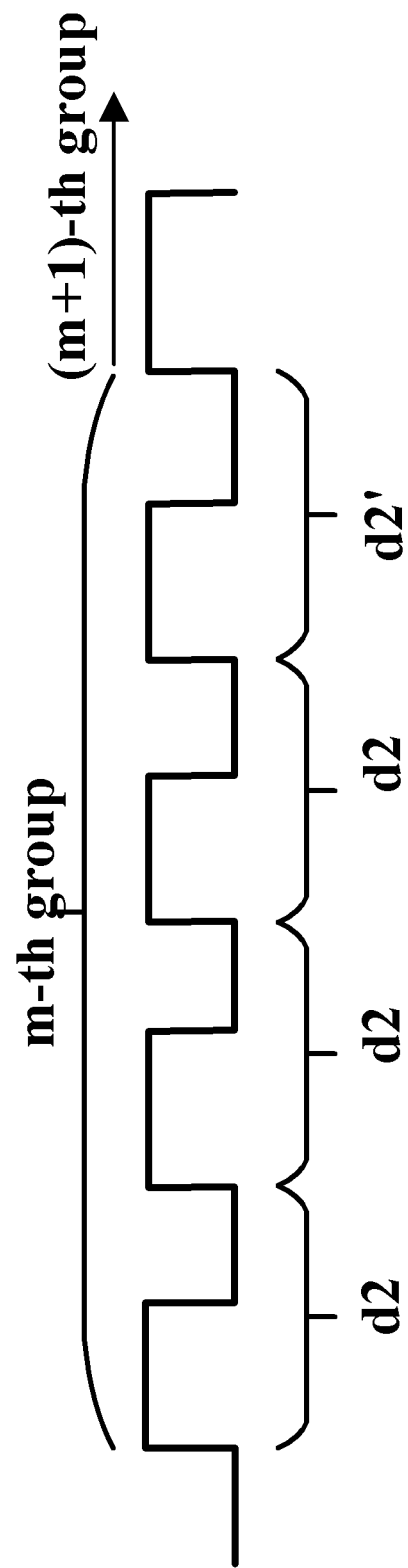
FIG. 16 depicts periods of second clock signals provided to a m-th group of M number of groups in some embodiments according to the present disclosure.

FIG. 16 depicts periods of second clock signals provided to a m-th group of M number of groups in some embodiments according to the present disclosure. Referring to FIG. 16, the second clock signals provided to a m-th group of M number of groups, except for a second clock signal provided to a stage immediately adjacent to a (m+1)-th group of the M number of groups, have a same period d2. The second clock signal provided to a stage immediately adjacent to a (m+1)-th group of the M number of groups has a period d2'. Optionally, d2 and d2' are different from each other. In one example, d2'>d2. In another example, d2'<d2.

As used herein, the term "period" refers to a sum of a duration for a high level component and a duration for a low level component. In the context of the first clock signal, the term "period" means a sum of a duration for the first level component and a duration for the second level component. In the context of the second clock signal, the term "period" means a sum of a duration for the third level component and a duration for the fourth level component.

Figure 17:
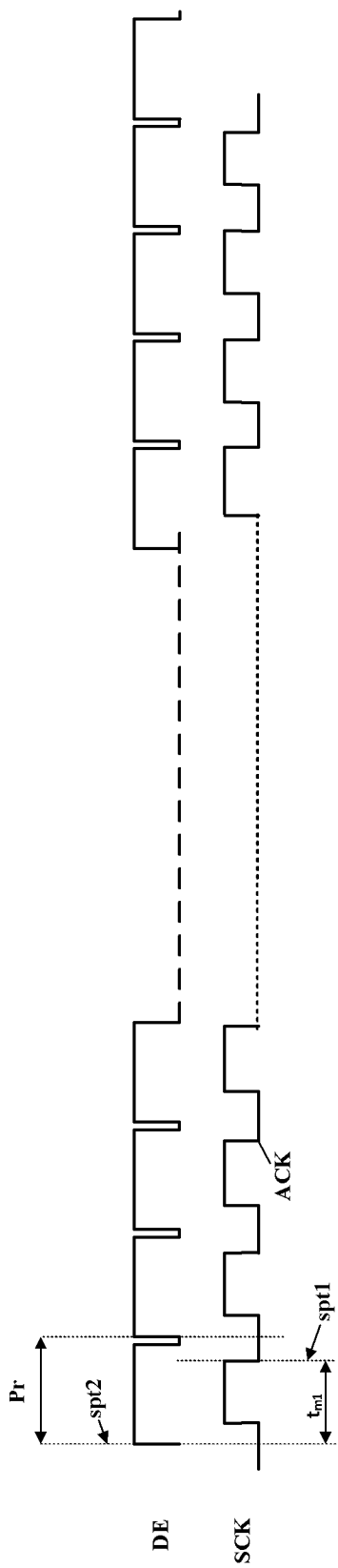
FIG. 17 illustrates phase shifts between N number of first clock signals and N number of data enabling signals in some embodiments according to the present disclosure.

FIG. 17 illustrates phase shifts between N number of first clock signals and N number of data enabling signals in some embodiments according to the present disclosure. Referring to FIG. 17, with respect to N number of data enabling signals DE, a difference between a starting point spt1 of a first level component of an n-th first clock signal and a starting point spt2 of an n-th data enabling signal of the N number of data enabling signals DE is equal to $t_{m1}$. In some embodiments, values of $t_{m1}$ for first clock signals provided to different groups of the M number of groups are different. In some embodiments, the N number of data enabling signals DE has a same period Pde.

In some embodiments, values of $t_{m1}$ for first clock signals provided to different groups of the M number of groups gradually increase group-by-group. Optionally, a value of $t_{m1}$ for first clock signals provided to a m-th group of the M number of groups is less than a value of $t_{m1}$ for first clock signals provided to a (m+1)-th group of the M number of groups, 1≤m≤(M−1). Optionally, values of $t_{m1}$ for first clock signals provided to a same group of the M number of groups are the same.

In some embodiments, a starting point is a falling edge of a signal. For example, in the context of the first clock signal, the starting point spt1 is a falling edge of the first level component.

In some embodiments, a starting point is a rising edge of a signal. For example, in the context of the data enabling signal, the starting point spt2 of an n-th data enabling signal of the N number of data enabling signals DE is a rising edge of the n-th data enabling signal.

Figure 18:
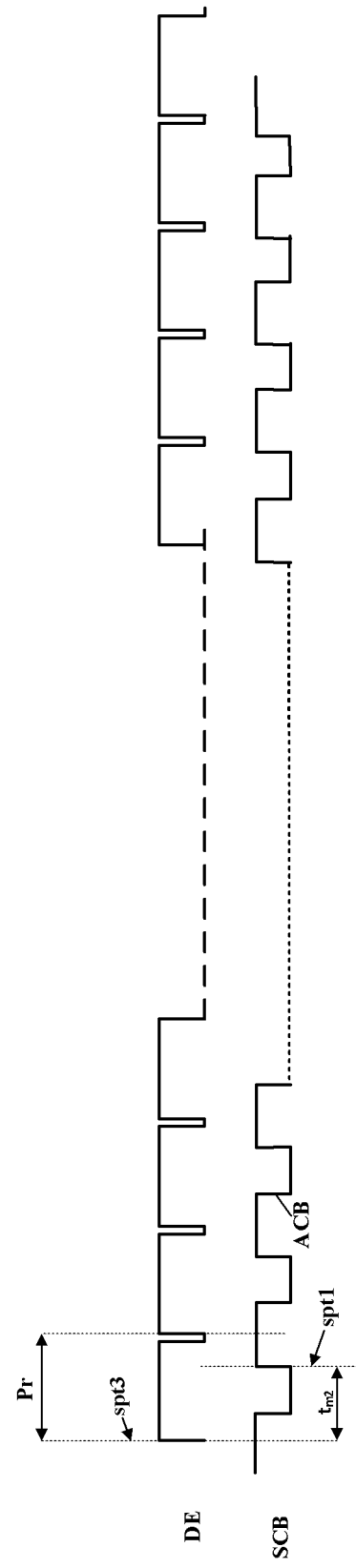
FIG. 18 illustrates phase shifts between N number of second clock signals and N number of data enabling signals in some embodiments according to the present disclosure.

FIG. 18 illustrates phase shifts between N number of second clock signals and N number of data enabling signals in some embodiments according to the present disclosure. Referring to FIG. 18, with respect to N number of data enabling signals DE, a difference between a starting point spt3 of a first level component of an n-th second clock signal and the starting point spt2 of an n-th data enabling signal of the N number of data enabling signals DE is equal to $t_{m2}$. In some embodiments, values of $t_{m2}$ for second clock signals provided to different groups of the M number of groups are different. In some embodiments, the N number of data enabling signals DE has a same period Pde.

In some embodiments, values of $t_{m2}$ for second clock signals provided to different groups of the M number of groups gradually increase group-by-group. Optionally, a value of $t_{m2}$ for second clock signals provided to a m-th group of the M number of groups is less than a value of $t_{m2}$ for second clock signals provided to a (m+1)-th group of the M number of groups, 1≤m≤(M−1). Optionally, values of $t_{m2}$ for second clock signals provided to a same group of the M number of groups are the same.

In some embodiments, a starting point is a rising edge of a signal. For example, in the context of the second clock signal, the starting point spt3 is a rising edge of the third level component.

In some embodiments, a starting point is a rising edge of a signal. For example, in the context of the data enabling signal, the starting point spt2 of an n-th data enabling signal of the N number of data enabling signals DE is a rising edge of the n-th data enabling signal.

Referring to FIG. 9, in some embodiments, the starting signal is shifted to be in-phase with at least one of the first clock signal or the second clock signal.

The phase shifts of the clock signals may be achieved by either changing duty cycles of the clock signals, or by maintaining the duty cycles of the clock signals. In some embodiments, duty cycles of first clock signals provided to the M number of groups are the same. In some embodiments, duty cycles of first clock signals provided to the M number of groups gradually decrease or increase group-by-group. In some embodiments, duty cycles of second clock signals provided to the M number of groups are the same. In some embodiments, duty cycles of second clock signals provided to the M number of groups gradually decrease or increase group-by-group.

Figure 19:
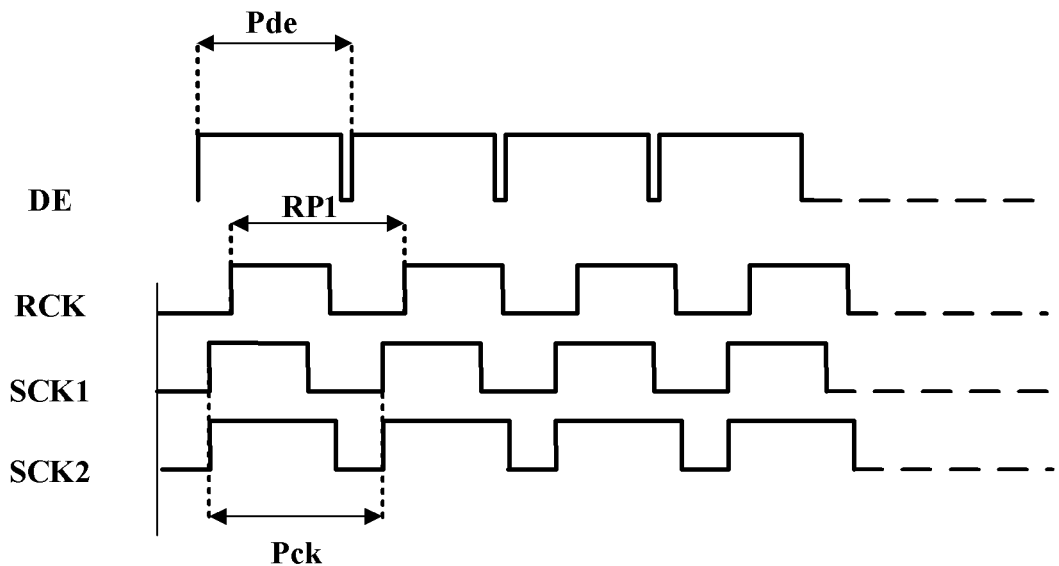
FIG. 19 illustrates phase shifts of first clock signals relative to first reference clock signals or data enabling signals in some embodiments according to the present disclosure.

FIG. 19 illustrates phase shifts of first clock signals relative to first reference clock signals or data enabling signals in some embodiments according to the present disclosure. Referring to FIG. 19, phase shifts of first clock signals may be achieved by maintaining the duty cycles of the first clock signals (denoted by SCK1) relative to first reference clock signals (denoted by RCK); or by changing duty cycles of the first clock signals (denoted by SCK2) relative to first reference clock signals (denoted by RCK). In some embodiments, the N number of data enabling signals DE have a same period Pde; the N number of first reference clock signals RCK have a same period RP1; the N number of first clock signals SCK1 or the N number of first clock signals SCK2 have a same period Pck. Optionally, RP1 and Pck are the same. Optionally, Pde, RP1, and Pck are the same.

In some embodiments, duty cycles of first clock signals provided to the M number of groups are the same (see, e.g., SCK1). Optionally, duty cycles of first clock signals provided to the M number of groups are the same as the duty cycles of first reference clock signals RCK.

In some embodiments, duty cycles of first clock signals provided to the M number of groups gradually decrease group-by-group (see, e.g., SCK2).

In some embodiments, duty cycles of first clock signals provided to the M number of groups gradually increase group-by-group. In the example depicted in FIG. 19, duty cycles of first clock signals provided to a m-th group of the M number of groups are smaller than duty cycles of first clock signals provided to a (m+1)-th group of the M number of groups, 1≤m≤(M−1), duty cycles of first clock signals provided to a first group of the M number of groups being the smallest, and duty cycles of first clock signals provided to a last group of the M number of groups being the largest. In one example, the duty cycles of first clock signals provided to a last group of the M number of groups is the same as the duty cycles of first reference clock signals RCK.

Figure 20:
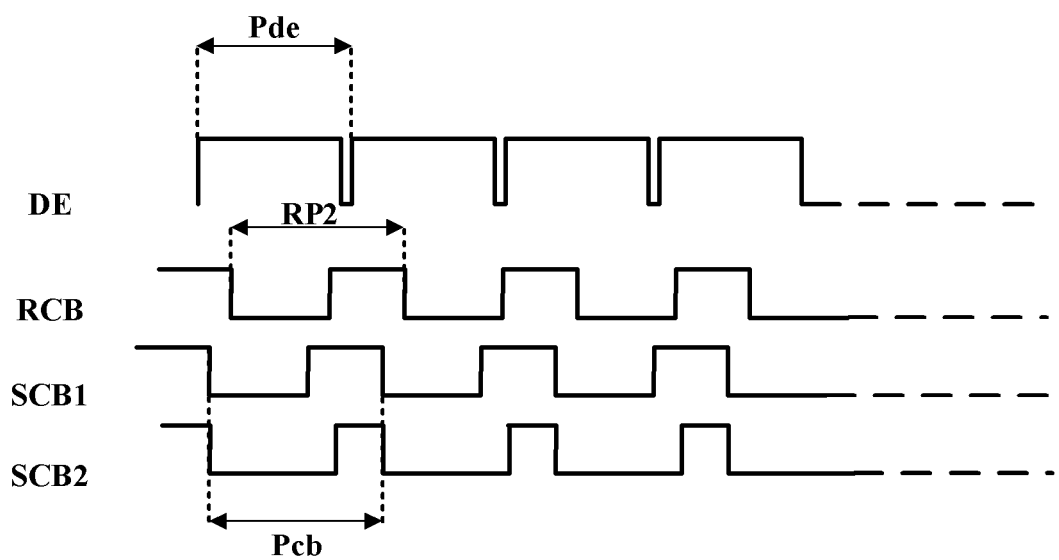
FIG. 20 illustrates phase shifts of second clock signals relative to second reference clock signals or data enabling signals in some embodiments according to the present disclosure.

FIG. 20 illustrates phase shifts of second clock signals relative to second reference clock signals or data enabling signals in some embodiments according to the present disclosure. Referring to FIG. 20, phase shifts of second clock signals may be achieved by maintaining the duty cycles of the second clock signals (denoted by SCB1) relative to second reference clock signals (denoted by RCB); or by changing duty cycles of the second clock signals (denoted by SCB2) relative to second reference clock signals (denoted by RCB). In some embodiments, the N number of data enabling signals DE have a same period Pde; the N number of second reference clock signals RCB have a same period RP2; the N number of second clock signals SCB1 or the N number of second clock signals SCB2 have a same period Pcb. Optionally, RP2 and Pcb are the same. Optionally, Pde, RP2, and Pcb are the same.

In some embodiments, duty cycles of second clock signals provided to the M number of groups are the same (see, e.g., SCB1). Optionally, duty cycles of second clock signals provided to the M number of groups are the same are the same as the duty cycles of second reference clock signals RCB.

In some embodiments, duty cycles of second clock signals provided to the M number of groups gradually decrease group-by-group (see, e.g., SCB2).

In some embodiments, duty cycles of second clock signals provided to the M number of groups gradually increase group-by-group. In the example depicted in FIG. 20, duty cycles of second clock signals provided to a m-th group of the M number of groups are smaller than duty cycles of second clock signals provided to a (m+1)-th group of the M number of groups, 1≤m≤(M−1), duty cycles of second clock signals provided to a first group of the M number of groups being the smallest, and duty cycles of second clock signals provided to a last group of the M number of groups being the largest. In one example, the duty cycles of second clock signals provided to a last group of the M number of groups is the same as the duty cycles of second reference clock signals RCB.

Figures 21, 22:
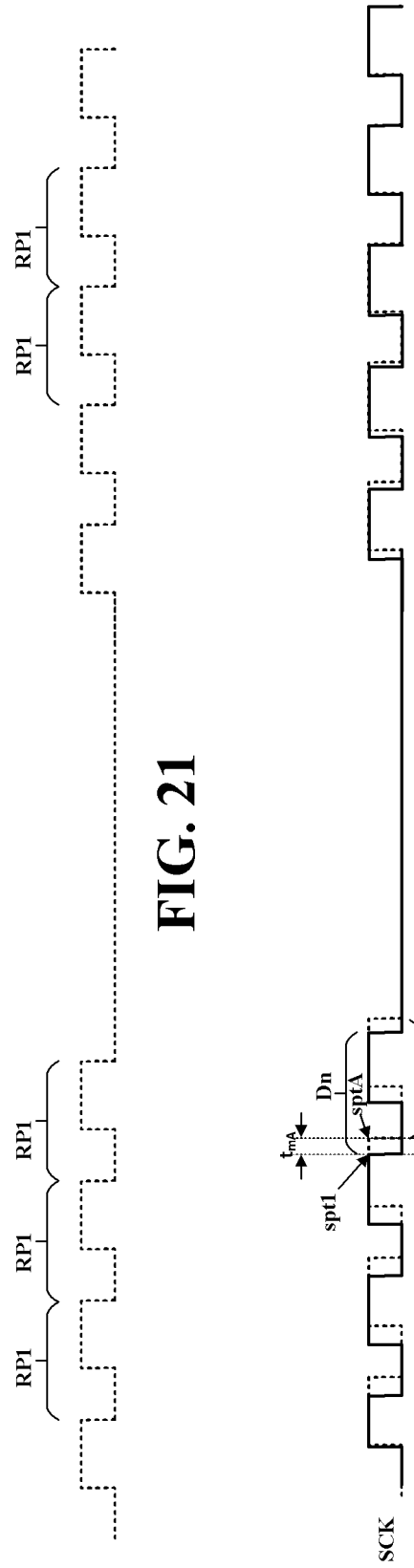
FIG. 21 illustrates N number of first reference periods with respect to N number of first clock signals in some embodiments according to the present disclosure.
FIG. 22 illustrates phase shifts between N number of first clock signals and N number of first reference periods in some embodiments according to the present disclosure.

FIG. 21 illustrates N number of first reference periods with respect to N number of first clock signals in some embodiments according to the present disclosure. Referring to FIG. 21, N number of first reference periods RP1 denote hypothetical repeating periods of first reference clock signals (e.g., RCK in FIG. 9) generated without phase shifts described in the present disclosure. Durations of the N number of first reference periods RP1 are the same. FIG. 22 illustrates phase shifts between N number of first clock signals and N number of first reference periods in some embodiments according to the present disclosure. Referring to FIG. 21 and FIG. 22, an N-th first reference period of the N number of first reference periods RP1 completely overlaps with an N-th period of the N number of first clock signals SCK. At least a first period of the N number of first clock signals SCK is partially non-overlapping with a $1^{st}$ first reference period of the N number of first reference periods RP1, as shown in FIG. 21 and FIG. 22.

In some embodiments, with respect to N number of first reference periods RP1, a difference between a starting point spt1 of a first level component of an n-th first clock signal and a starting point sptA of an n-th first reference period of the N number of first reference periods RP1 is equal to $t_{mA}$. In some embodiments, values of $t_{mA}$ for first clock signals provided to different groups of the M number of groups are different.

In some embodiments, values of $t_{mA}$ for first clock signals provided to different groups of the M number of groups gradually decrease group-by-group. Optionally, a value of $t_{mA}$ for first clock signals provided to a m-th group of the M number of groups is greater than a value of $t_{mA}$ for first clock signals provided to a (m+1)-th group of the M number of groups, 1≤m≤(M−1). Optionally, values of $t_{mA}$ for first clock signals provided to a same group of the M number of groups are the same.

In some embodiments, a starting point is a falling edge of a signal. For example, in the context of the first clock signal, the starting point spt1 is a falling edge of the first level component.

Figure 23:
FIG. 23 illustrates N number of second reference periods with respect to N number of second clock signals in some embodiments according to the present disclosure.
Figure 24:
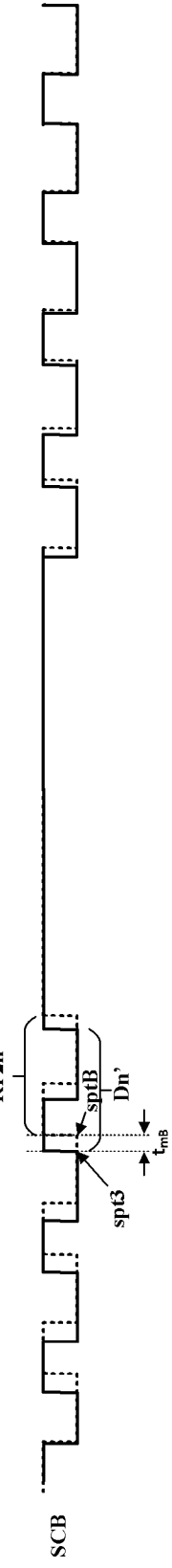
FIG. 24 illustrates phase shifts between N number of second clock signals and N number of second reference periods in some embodiments according to the present disclosure.

FIG. 23 illustrates N number of second reference periods with respect to N number of second clock signals in some embodiments according to the present disclosure. Referring to FIG. 23, N number of second reference periods RP2 denote hypothetical repeating periods of second reference clock signals (e.g., RCB in FIG. 9) generated without phase shifts described in the present disclosure. Durations of the N number of second reference periods RP2 are the same. FIG. 24 illustrates phase shifts between N number of second clock signals and N number of second reference periods in some embodiments according to the present disclosure. Referring to FIG. 23 and FIG. 24, an N-th second reference period of the N number of second reference periods RP2 completely overlaps with an N-th period of the N number of second clock signals SCB. At least a first period of the N number of second clock signals SCB is partially non-overlapping with a $1^{st}$ second reference period of the N number of second reference periods RP2, as shown in FIG. 23 and FIG. 24.

In some embodiments, with respect to N number of second reference periods RP2, a difference between a starting point spt3 of a first level component of an n-th second clock signal and a starting point sptB of an n-th second reference period of the N number of second reference periods RP2 is equal to $t_{mB}$. In some embodiments, values of $t_{mB}$ for second clock signals provided to different groups of the M number of groups are different.

In some embodiments, values of $t_{mB}$ for second clock signals provided to different groups of the M number of groups gradually decrease group-by-group. Optionally, a value of $t_{mB}$ for second clock signals provided to a m-th group of the M number of groups is greater than a value of $t_{mB}$ for second clock signals provided to a (m+1)-th group of the M number of groups, 1≤m≤(M−1). Optionally, values of $t_{mB}$ for second clock signals provided to a same group of the M number of groups are the same.

In some embodiments, a starting point is a rising edge of a signal. For example, in the context of the second clock signal, the starting point spt3 is a rising edge of the third level component.

Referring to FIG. 9, in some embodiments, the starting signal is shifted to be in-phase with at least one of the first clock signal or the second clock signal.

The phase shifts of the clock signals may be achieved by either changing duty cycles of the clock signals, or by maintaining the duty cycles of the clock signals. In some embodiments, duty cycles of first clock signals provided to the M number of groups are the same. In some embodiments, duty cycles of first clock signals provided to the M number of groups gradually decrease or increase group-by-group. In some embodiments, duty cycles of second clock signals provided to the M number of groups are the same. In some embodiments, duty cycles of second clock signals provided to the M number of groups gradually decrease or increase group-by-group.

Figure 25:
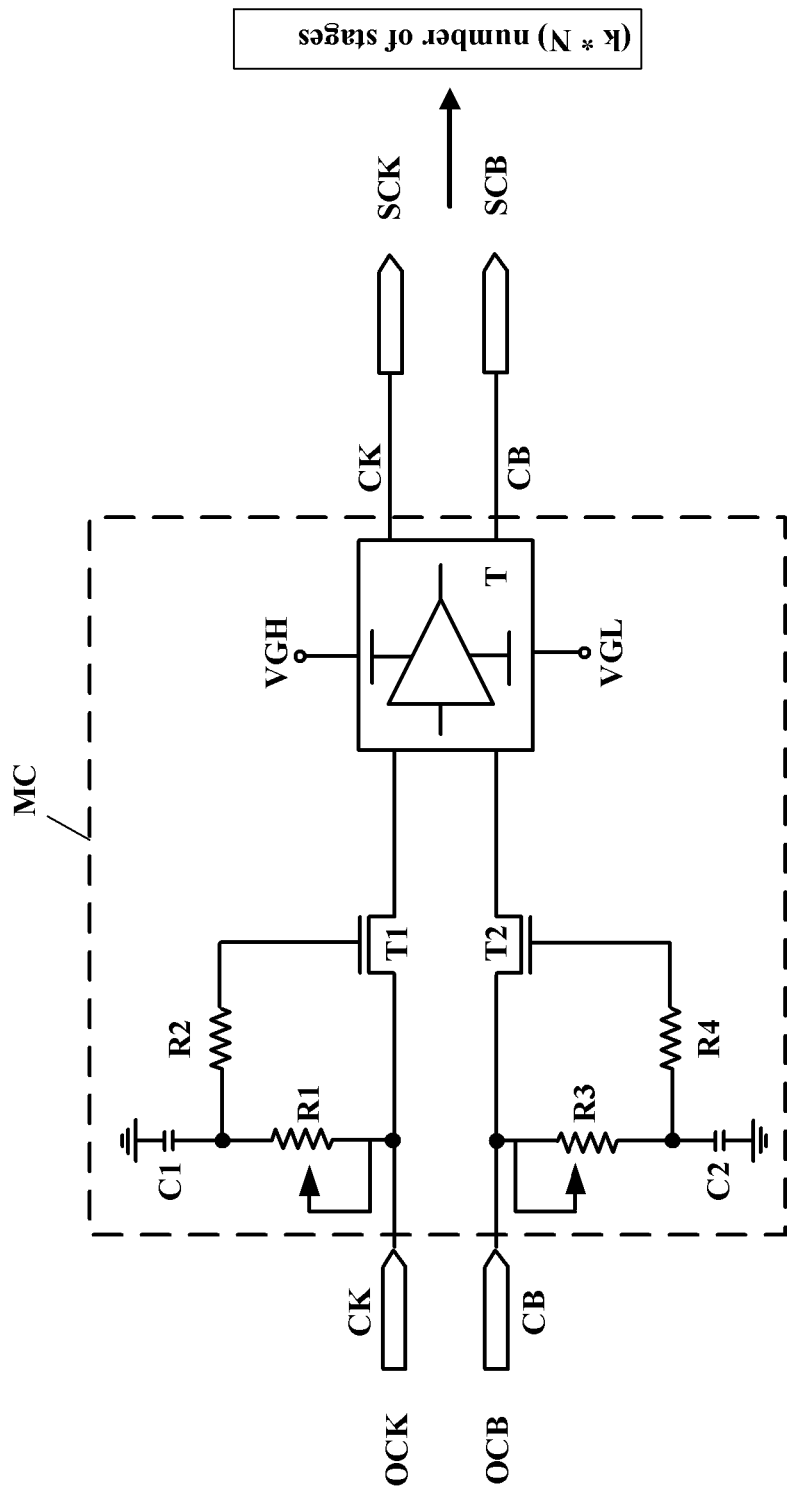
FIG. 25 is a circuit diagram illustrating the structure of a modulation circuit in some embodiments according to the present disclosure.

In some embodiments, the method further includes providing a first clock signal line; and providing a modulation circuit coupling the first clock signal line to the (k*N) number of stages. FIG. 25 is a circuit diagram illustrating the structure of a modulation circuit in some embodiments according to the present disclosure. Referring to FIG. 25, the first clock signal line CK is coupled to the modulation circuit MC, and the modulation circuit MC is configured to convert original first clock signals OCK transmitted by the first clock signal line CK into N number of first clock signals time-sequentially provided to the (k*N) number of stages, respectively.

In some embodiments, the method further includes providing a second clock signal line CB. The second clock signal line CB is coupled to the modulation circuit MC, and the modulation circuit MC is configured to convert original second clock signals OCB transmitted by the second clock signal line CB into N number of second clock signals time-sequentially provided to the (k*N) number of stages, respectively.

In some embodiments, the modulation circuit MC includes a first transistor T1; a first resistance R1; a second resistance R2; a first capacitor C1; and a triode T. A first electrode of the first transistor T1 is coupled to the first clock signal line CK and a first terminal of the first resistance R1. A second electrode of the first transistor T1 is coupled to the triode T. A second terminal of the first resistance R1 is coupled to a first electrode of the first capacitor C1 and a first terminal of the second resistance R2. A gate electrode of the first transistor T1 is coupled to a second terminal of the second resistance R2. An output terminal of the triode T is coupled to the (k*N) number of stages.

In some embodiments, the method further includes providing, through the modulation circuit MC, N number of first clock signals time-sequentially to the (k*N) number of stages, respectively. In some embodiments, the method further includes gradually increasing a resistance value of the first resistance R1 thereby gradually increasing values of $t_{m1}$ for first clock signals provided to the M number of groups group-by-group, wherein $t_{m1}$ is a difference between a starting point spt1 of a first level component of an n-th first clock signal and a starting point spt2 of an n-th data enabling signal of the N number of data enabling signals DE. The greater the resistance value of the first resistance R1, the longer it takes for the triode to be turned on, and the greater the value of $t_{m1}$ for the first clock signal is. The smaller the resistance value of the first resistance R1, the sooner it takes for the triode to be turned on, and the smaller the value of $t_{m1}$ for the first clock signal is. As a result, values of $t_{m1}$ for first clock signals provided to the M number of groups gradually increase group-by-group.

In some embodiments, the modulation circuit MC includes a second transistor T2; a third resistance R3; a fourth resistance R4; a second capacitor C2; and a triode T. A first electrode of the second transistor T2 is coupled to the second clock signal line CB and a first terminal of the third resistance R3. A second electrode of the second transistor T2 is coupled to the triode T. A second terminal of the third resistance R3 is coupled to a first electrode of the second capacitor C2 and a first terminal of the fourth resistance R4. A gate electrode of the second transistor T2 is coupled to a second terminal of the fourth resistance R4. An output terminal of the triode T is coupled to the (k*N) number of stages.

In some embodiments, the method further includes providing, through the modulation circuit MC, N number of second clock signals time-sequentially to the (k*N) number of stages, respectively. In some embodiments, the method further includes gradually increasing a resistance value of the third resistance R3 thereby gradually increasing values of $t_{m2}$ for second clock signals provided to the M number of groups group-by-group, wherein $t_{m2}$ is a difference between a starting point spt3 of a first level component of an n-th second clock signal and the starting point spt2 of an n-th data enabling signal of the N number of data enabling signals DE. The greater the resistance value of the third resistance R3, the longer it takes for the triode to be turned on, and the greater the value of $t_{m2}$ for the second clock signal is. The smaller the resistance value of the third resistance R3, the sooner it takes for the triode to be turned on, and the smaller the value of $t_{m2}$ for the second clock signal is. As a result, values of $t_{m2}$ for second clock signals provided to the M number of groups gradually increase group-by-group.

In another aspect, the present disclosure provides a scan circuit. In some embodiments, the scan circuit includes (k*N) number of stages; a first clock signal line; and a modulation circuit configured to convert original first clock signals transmitted by the first clock signal line into N number of first clock signals time-sequentially provided to the (k*N) number of stages, respectively. Optionally, the (k*N) number of stages comprising M number of groups, a respective group of the M number of groups comprising one or more stages of the scan circuit, N, k, M being integers; N≥2, k≥1; M≥2. Optionally, a respective first clock signal of the N number of first clock signals comprises a first level component and a second level component following the first level component. Optionally, a m-th group of the M number of groups is configured to receive first clock signals before a (m+1)-th group of the M number of groups is configured to receive first clock signals, 1≤m≤(M−1). Optionally, with respect to N number of data enabling signals, a difference between a starting point of a first level component of an n-th first clock signal and a starting point of an n-th data enabling signal of the N number of data enabling signals is equal to $t_{m1}$. Optionally, values of $t_{m1}$ for first clock signals provided to different groups of the M number of groups are different. Optionally, the N number of data enabling signals are signals provided to a timing controller coupled to the scan circuit, and configured to control a timing of data output Referring to FIG. 25, in some embodiments, the modulation circuit MC includes a first transistor T1; a first resistance R1; a second resistance R2; a first capacitor C1; and a triode T. A first electrode of the first transistor T1 is coupled to the first clock signal line CK and a first terminal of the first resistance R1. A second electrode of the first transistor T1 is coupled to the triode T. A second terminal of the first resistance R1 is coupled to a first electrode of the first capacitor C1 and a first terminal of the second resistance R2. A gate electrode of the first transistor T1 is coupled to a second terminal of the second resistance R2. An output terminal of the triode T is coupled to the (k*N) number of stages.

In some embodiments, the scan circuit further includes a second clock signal line. Optionally, the modulation circuit MC is further configured to convert original second clock signals transmitted by the second clock signal line into N number of second clock signals time-sequentially provided to the (k*N) number of stages, respectively. Optionally, a respective second clock signal of the N number of second clock signals comprises a third level component and a fourth level component following the third level component. Optionally, a m-th group of the M number of groups is configured to receive second clock signals before a (m+1)-th group of the M number of groups is configured to receive second clock signals. Optionally, with respect to the N number of data enabling signals, a difference between a starting point of a third level component of an n-th second clock signal and a starting point of the n-th data enabling signal of the N number of data enabling signals is equal to $t_{m2}$. Optionally, values of $t_{m2}$ for second clock signals provided to different groups of the M number of groups are different In some embodiments, the modulation circuit MC includes a second transistor T2; a third resistance R3; a fourth resistance R4; a second capacitor C2; and a triode T. A first electrode of the second transistor T2 is coupled to the second clock signal line CB and a first terminal of the third resistance R3. A second electrode of the second transistor T2 is coupled to the triode T. A second terminal of the third resistance R3 is coupled to a first electrode of the second capacitor C2 and a first terminal of the fourth resistance R4. A gate electrode of the second transistor T2 is coupled to a second terminal of the fourth resistance R4. An output terminal of the triode T is coupled to the (k*N) number of stages.

Figure 26:
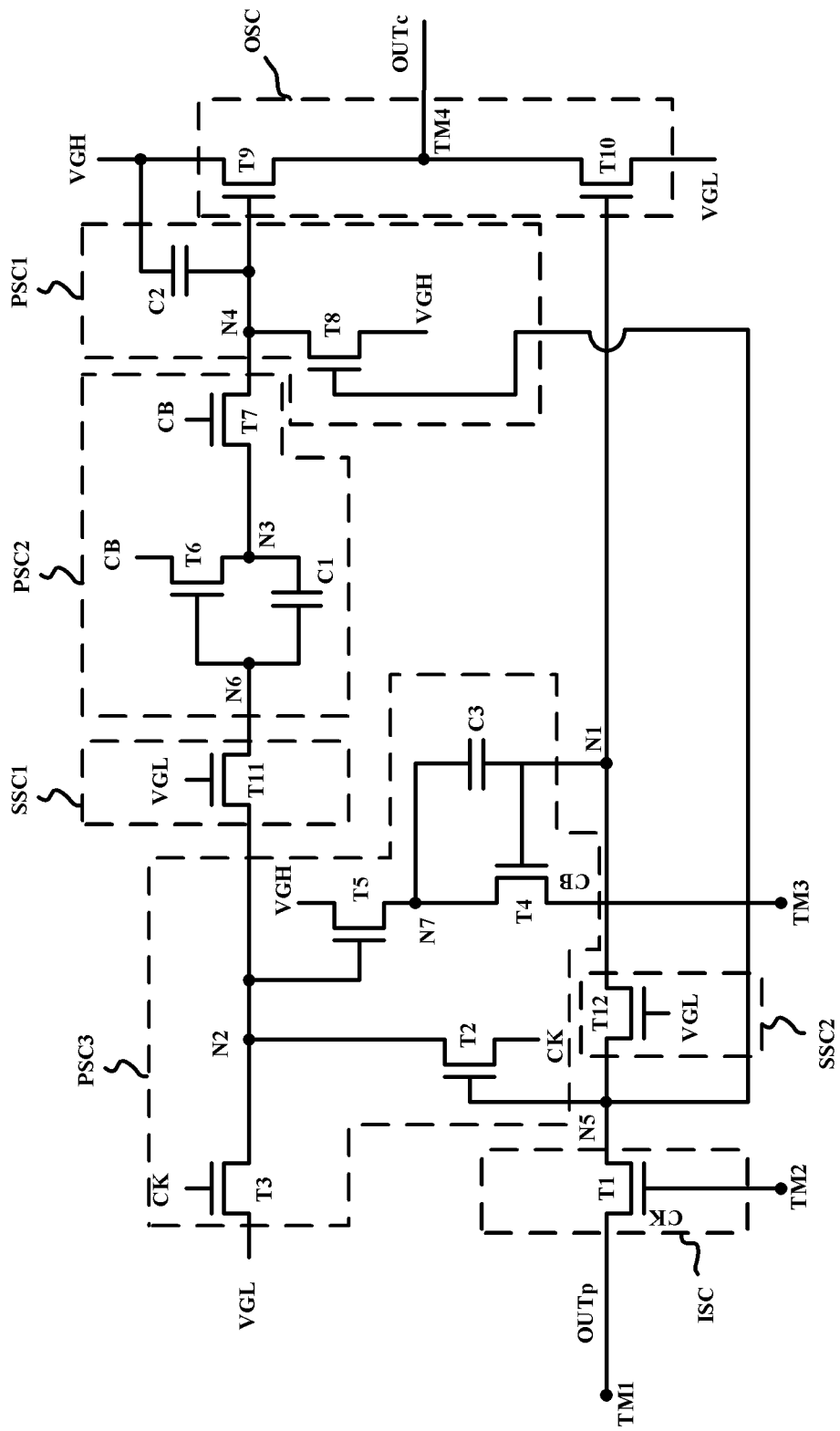
FIG. 26 is a circuit diagram of a respective scan unit in some embodiments according to the present disclosure.

Various appropriate structures of stages of the scan circuit may be implemented in the present scan circuit. FIG. 26 is a circuit diagram of a respective scan unit in some embodiments according to the present disclosure. Referring to FIG. 26, the respective scan unit in some embodiments includes an input subcircuit ISC, an output subcircuit OSC, a first processing subcircuit PSC1, a second processing subcircuit PSC2, a third processing subcircuit PSC3, a first stabilizing subcircuit SSC1, and a second stabilizing subcircuit SSC2.

In some embodiments, the output subcircuit OSC is configured to supply the voltage of a first power supply VGH or a second power supply VGL to an output terminal TM4 in response to voltages of a fourth node N4 and a first node N1. Optionally, the output subcircuit OSC includes a ninth transistor T9 and a tenth transistor T10.

The ninth transistor T9 is coupled between a first power supply VGH and the output terminal TM4. A gate electrode of the ninth transistor T9 is coupled to the fourth node N4. The ninth transistor T9 may be turned on or off depending on the voltage of the fourth node N4. Optionally, when the ninth transistor T9 is turned on, the voltage of the first power supply VGH is provided to the output terminal TM4, which (annotated as Outc in FIG. 26) may be transmitted to a n-th gate line and used as a gate driving signal having a gate-on level.

The tenth transistor T10 is coupled between the output terminal TM4 and a second power supply VGL. A gate electrode of the tenth transistor T10 is coupled to the first node N1. The tenth transistor T10 may be turned on or off depending on the voltage of the first node N1. Optionally, when the tenth transistor T10 is turned on, the voltage of the second power supply VGL is provided to the output terminal TM4, which (annotated as Outc in FIG. 26) may be provided to a n-th gate line and used as a gate driving signal having a gate-off level. In one example, when the gate driving signal has a gate-off level, it may be understood that the gate driving signal is not provided.

In some embodiments, the input subcircuit ISC is configured to control the voltages of the first node N1 and a fifth node N5 in response to signals provided to the first input terminal TM1 and the second input terminal TM2, respectively. Optionally, the input subcircuit ISC includes a first transistor T1.

The first transistor T1 is coupled between the first input terminal TM1 and the fifth node N5. A gate electrode of the first transistor T1 is coupled to the second input terminal TM2. When the first clock signal CK is provided to the second input terminal TM2, the first transistor T1 is turned on to electrically couple the first input terminal TM1 with the fifth node N5.

In some embodiments, the first processing subcircuit PSC1 is configured to control the voltage of the fourth node N4 in response to the voltages of the first node N1 and the fifth node N5. Optionally, the first processing subcircuit PSC1 includes an eighth transistor T8 and a second capacitor C2.

The eighth transistor T8 is coupled between the first power supply VGH and the fourth node N4. A gate electrode of the eighth transistor T8 is coupled to the fifth node N5. The eighth transistor T8 may be turned on or off depending on the voltage of the fifth node N5. Optionally, when the eighth transistor T8 is turned on, the voltage of the first power supply VGH may be provided to the fourth node N4.

The second capacitor C2 is coupled between the first power supply VGH and the fourth node N4. Optionally, the second capacitor C2 is configured to charge a voltage to be applied to the fourth node N4. Optionally, the second capacitor C2 is configured to stably maintain the voltage of the fourth node N4.

In some embodiments, the second processing subcircuit PSC2 is coupled to a sixth node N6, and is configured to control the voltage of the fourth node N4 in response to a signal input to the third input terminal TM3. Optionally, the second processing subcircuit PSC2 includes a sixth transistor T6, a seventh transistor T7, and a first capacitor C1.

A first terminal of the first capacitor C1 is coupled to the sixth node N6, and a second terminal of the first capacitor C1 is coupled to a third node N3 that is a common node between the sixth transistor T6 and the seventh transistor T7.

The sixth transistor T6 is coupled between the third node N3 and the sixth node N6. A gate electrode of the sixth transistor T6 is coupled to the sixth node N6. The sixth transistor T6 may be turned on depending on the voltage of the sixth node N6 so that a voltage corresponding to the second clock signal CB provided to the third input terminal TM3 may be applied to the third node N3.

The seventh transistor T7 is coupled between the fourth node N4 and the third node N3. A gate electrode of the seventh transistor T7 is coupled to the third input terminal TM3. The seventh transistor T7 may be turned on in response to the second clock signal CB provided to the third input terminal TM3, and thus, applies the voltage of the first power supply VGH to the third node N3.

In some embodiments, the third processing subcircuit PSC3 is configured to control the voltage of the second node N2. Optionally, the third processing subcircuit PSC3 includes a second transistor T2, a third transistor T3, a fourth transistor T4, a fifth transistor T5, and a third capacitor C3.

A first electrode of the third capacitor C3 is coupled to the first node N1, and a second electrode of the third capacitor C3 is coupled to a seventh node N7 that is a common node between the fourth transistor T4 and the fifth transistor T5.

The fifth transistor T5 is coupled between the first power supply VGH and the seventh node N7. A gate electrode of the fifth transistor T5 is coupled to the second node N2. The fifth transistor T5 may be turned on or off depending on the voltage of the second node N2.

The fourth transistor T4 is coupled between the seventh node N7 and the third input terminal TM3. A gate electrode of the fourth transistor T4 is coupled to the first node N1. The fourth transistor T4 may be turned on or off depending on the voltage of the first node N1.

The second transistor T2 is coupled between the second node N2 and the second input terminal TM2. A gate electrode of the second transistor T2 is coupled to the fifth node N5.

The third transistor T3 is coupled between the second node N2 and the second power supply VGL. A gate electrode of the third transistor T3 is coupled to the second input terminal TM2. When the first clock signal CK is provided to the second input terminal TM2, the third transistor T3 may be turned on so that the voltage of the second power supply VGL may be provided to the second node N2.

In some embodiments, the first stabilizing subcircuit SSC1 is coupled between the second processing subcircuit PSC2 and the third processing subcircuit PSC3. Optionally, the first stabilizing subcircuit SSC1 is configured to limit a voltage drop width of the second node N2. Optionally, the first stabilizing subcircuit SSC1 includes an eleventh transistor T11.

The eleventh transistor T11 is coupled between the second node N2 and the sixth node N6. A gate electrode of the eleventh transistor T11 is coupled to the second power supply VGL. Since the second power supply VGL has a gate-on level voltage, the eleventh transistor T11 may always remain turned on. Therefore, the second node N2 and the sixth node N6 may be maintained at the same voltage, and operated as substantially the same node.

In some embodiments, the second stabilizing subcircuit SSC2 is coupled between the first node N1 and the fifth node N5. Optionally, the second stabilizing subcircuit SSC2 is configured to limit a voltage drop width of the first node N1. Optionally, the second stabilizing subcircuit SSC2 includes a twelfth transistor T12.

The twelfth transistor T12 is coupled between the first node N1 and the fifth node N5. A gate electrode of the twelfth transistor T12 is coupled to the second power supply VGL. Since the second power supply VGL has a gate-on level voltage, the twelfth transistor T12 may always remain turned on. Therefore, the first node N1 and the fifth node N5 may be maintained at the same voltage, and operated as substantially the same node.

In some embodiments, each of the first to twelfth transistors T1 to T12 may be formed of a p-type transistor. In some embodiments, the gate-on voltage of the first to twelfth transistors T1 to T12 may be set to a low level, and the gate-off voltage thereof may be set to a high level.

Figure 27:
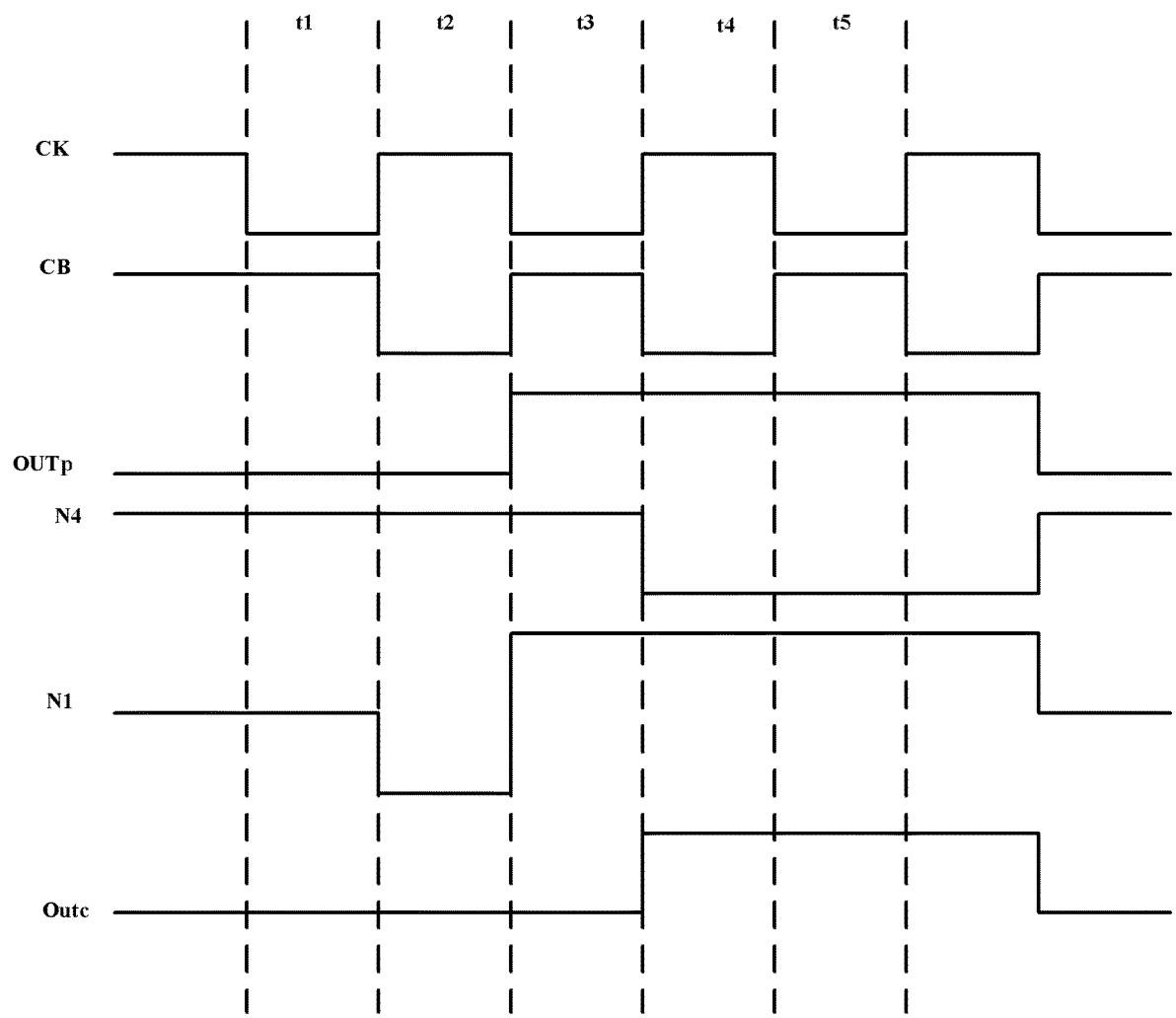
FIG. 27 is a timing diagram illustrating an operation of the scan unit of the stage illustrated in FIG. 26.

FIG. 27 is a timing diagram illustrating an operation of the scan unit of the stage illustrated in FIG. 26. Referring to FIG. 27, the first clock signal CK and the second clock signal CB each may have a cycle of two horizontal periods (2H), and have a gate-on level during different horizontal periods. Optionally, the second clock signal CB may be set to a signal shifted by a half cycle (i.e., one horizontal period (1H)) from the first clock signal CK.

In some embodiments, when the clock signals CK and CB are provided, the second input terminal TM2 and the third input terminal TM3 may be set to the low level, i.e., the voltage of the second power supply VGL. When the clock signals CK and CB are not provided, the second input terminal TM2 and the third input terminal TM3 may be set to the high level, i.e., the voltage of the first power supply VGH.

In some embodiments, when a start signal STV or an output signal Outp from an output terminal of a previous scan unit (e.g., a previous scan unit of a same stage or a previous scan unit of a previous stage) is provided, the first input terminal TM1 may be set to the high level, i.e., the voltage of the first power supply VGH. When the start signal STV or the output signal Outp from the output terminal of the previous scan unit is not provided, the first input terminal TM1 may be set to the low level, i.e., the voltage of the second power supply VGL.

In some embodiments, the start signal STV or the output signal Outp from the output terminal of the previous scan unit to be provided to the first input terminal TM1 may be set to overlap at least once with the first clock signal CK to be provided to the second input terminal TM2. Optionally, the start signal STV or the output signal Outp from the output terminal of the previous scan unit may have a width greater than that of the first clock signal CK and, for example, be provided during four horizontal periods (4H). In this case, an output signal to be provided to the first input terminal TM1 of the next stage may also overlap at least once with the second clock signal CB to be provided to the second input terminal TM2 of the next stage.

In some embodiments, during a first period t1, the first clock signal CK is provided to the second input terminal TM2. The first transistor T1 and the third transistor T3 are turned on. Furthermore, during the first period t1, the second clock signal CB is not provided to the third input terminal TM3, the seventh transistor T7 is turned off.

In some embodiments, when the first transistor T1 is turned on, the first input terminal TM1 and the fifth node N5 are electrically coupled to each other. The twelfth transistor T12 remains turned on, the first input terminal TM1 is electrically coupled with the first node N1 via the fifth node N5.

In some embodiments, during the first period t1, the start signal STV or the output signal Outp from the output terminal of the previous scan unit to be provided to the first input terminal TM1 has the low level, a low voltage (e.g., the voltage of the second power supply VGL) may be applied to the fifth node N5 and the first node N1. When the fifth node N5 and the first node N1 are set to the low voltage, the second transistor T2, the fourth transistor T4, the eighth transistor T8, and the tenth transistor T10 are turned on.

In some embodiments, when the fourth transistor T4 is turned on, the third input terminal TM3 and the seventh node N7 are electrically coupled to each other. The second clock signal CB is not provided to the third input terminal TM3 during the first period t1, a high voltage may be provided to the seventh node N7. The third capacitor C3 is configured to charge a voltage corresponding to the turned-on state of the fourth transistor T4.

In some embodiments, when the fourth transistor T4 is turned on, the fifth transistor T5 is connected in the form of a diode between the second node N2 and the first power supply VGH. When the fifth transistor T5 is turned on during the first period t1, the voltage of the first power supply VGH is not transmitted to the second node N2, and the voltage of the second node N2 is maintained at the voltage of the preceding state, e.g., the high voltage. The eleventh transistor T11 remains turned on, the high voltage of the second node N2 is applied to the sixth node N6, and the sixth node N6 is set to the high voltage. The second transistor T2 and the sixth transistor T6 are turned off.

In some embodiments, when the eighth transistor T8 is turned on, the voltage of the first power supply VGH is provided to the fourth node N4. The ninth transistor T9 is turned off.

In some embodiments, when the tenth transistor T10 is turned on, the voltage of the second power supply VGL is provided to the output terminal TM4. During the first period t1, the gate driving signal are not provided to the n-th stage gate line.

In some embodiments, during a second period t2, the supply of the first clock signal CK to the second input terminal TM2 is interrupted. The first transistor T1 and the fifth transistor T5 are turned off. The fourth node N4 and the first node N1 maintain the voltages of the preceding period by the second capacitor C2 and the third capacitor C3. Since the fourth node N4 remains in the high voltage state, the ninth transistor T9 remains turned off. Since the first node N1 remains in the low voltage state, the second transistor T2, the fourth transistor T4, the eighth transistor T8, and the tenth transistor T10 remain turned on.

In some embodiments, during the second period t2, the second clock signal CB is provided to the third input terminal TM3. The seventh transistor T7 is turned on by the second clock signal CB provided to the third input terminal TM3. When the seventh transistor T7 is turned on, the fourth node N4 and the third node N3 are electrically coupled to each other. The third node N3 is set to the high voltage.

In some embodiments, during the second period t2, the second clock signal CB is provided to the seventh node N7 via the fourth transistor T4 that is turned on. A low voltage is provided to the seventh node N7. The voltage of the first node N1 is maintained at a voltage (a 2-step low voltage) less than the voltage of the second power supply VGL by coupling of the third capacitor C3.

In some embodiments, during a third period t3, the supply of the second clock signal CB to the third input terminal TM3 is interrupted. When the supply of the second clock signal CB is interrupted, the seventh transistor T7 is turned off.

In some embodiments, during the third period t3, the start signal STV or the output signal Outp from the output terminal of the previous scan unit is provided to the first input terminal TM1, and the first clock signal CK is provided to the second input terminal TM2. When the first clock signal CK is provided to the second input terminal TM2, the first transistor T1 and the third transistor T3 are turned on.

In some embodiments, when the first transistor T1 is turned on, the first input terminal TM1 and the fifth node N5 are electrically coupled to each other. The twelfth transistor T12 remains turned on, the first input terminal TM1 is electrically coupled with the first node N1 via the fifth node N5. The fifth node N5 and the first node N1 are set to the high voltage by the start signal STV or the output signal Outp from the output terminal of the previous scan unit that is provided to the first input terminal TM1. When the fifth node N5 and the first node N1 are set to the high voltage, the second transistor T2, the fourth transistor T4, the eighth transistor T8, and the tenth transistor T10 are turned off.

In some embodiments, when the third transistor T3 is turned on, the low voltage of the second power supply VGL is applied to the second node N2 so that the second node N2 and the sixth node N6 are set to the low voltage. The fifth transistor T5 and the sixth transistor T6 may be turned on.

In some embodiments, when the fifth transistor T5 is turned on, the voltage of the first power supply VGH is applied to the seventh node N7. The seventh node N7 is maintained at the high voltage. Since the fourth transistor T4 remains turned off, the voltage of the second clock signal CB to be applied to the third input terminal TM3 is not transmitted to the seventh node N7. Since both the seventh node N7 and the first node N1 that are the opposite ends of the third capacitor C3 are maintained at the high voltage, the third capacitor C3 is not charged or discharged. A current path is formed from the first power supply VGH to the first node N1 via the fifth transistor T5, and the high voltage of the first power supply VGH is transmitted to the first node N1. The voltage of the first node N1 is stably maintained at the high level.

In some embodiments, when the sixth transistor T6 is turned on, the third input terminal TM3 and the third node N3 are electrically coupled to each other. Since the second clock signal CB is not provided to the third input terminal TM3 during the third period t3, the third node N3 is maintained at the high voltage. Since the seventh transistor T7 remains turned off, the voltage of the third node N3 does not affect the voltage of the fourth node N4. The first capacitor C1 is configured to store a voltage corresponding to the turn-on level of the sixth transistor T6.

In some embodiments, during a fourth period t4, the second clock signal CB may be provided to the third input terminal TM3. When the second clock signal CB is provided to the third input terminal TM3, the seventh transistor T7 is turned on.

In some embodiments, when the seventh transistor T7 is turned on, the fourth node N4 and the third node N3 are electrically coupled to each other. The low voltage of the second clock signal CB that is provided to the third input terminal TM3 via the sixth transistor T6 that remains turned on is provided to the third node N3 and the fourth node N4. When the low voltage is provided to the fourth node N4, the ninth transistor T9 is turned on.

In some embodiments, when the ninth transistor T9 is turned on, the voltage of the first power supply VGH is provided to the output terminal TM4. The voltage of the first power supply VGH that is provided to the output terminal TM4 is provided to the n-th stage gate line as the gate driving signal.

In some embodiments, during a fifth period t5, the supply of the second clock signal CB to the third input terminal TM3 is interrupted. When the supply of the second clock signal CB is interrupted, the seventh transistor T7 is turned off. The fourth node N4 is stably maintained at the high voltage by the second capacitor C2. The ninth transistor T9 remains turned on, and the voltage of the first power supply VGH is provided to the n-th stage gate line as the gate driving signal.

Although the supply of the second clock signal CB is interrupted during the fifth period t5, the fourth transistor T4 remains turned off and, therefore, the voltage of the second clock signal CB is not provided to the seventh node N7 and does not affect the voltage of the first node N1.

As described above, in some embodiments, during the supply of the gate driving signal, the fourth transistor T4 that remains turned off prevents a change in voltage of the second clock signal CB from affecting the first node N1, whereby the first node N1 may be stably maintained at the high voltage. Furthermore, in some embodiments, during the supply of the gate driving signal, the third capacitor C3 is prevented from being charged or discharged. The third capacitor C3 does not perform a charging or discharging operation at any time other than when the voltage of the first node N1 is set to the low level by the coupling of the third capacitor C3. Therefore, in some embodiments, during the supply of the gate driving signal, the third capacitor C3 does not act as a load. Consequently, the power consumption may be reduced, and reliable output of the gate driving signal may be secured.

Figure 28:
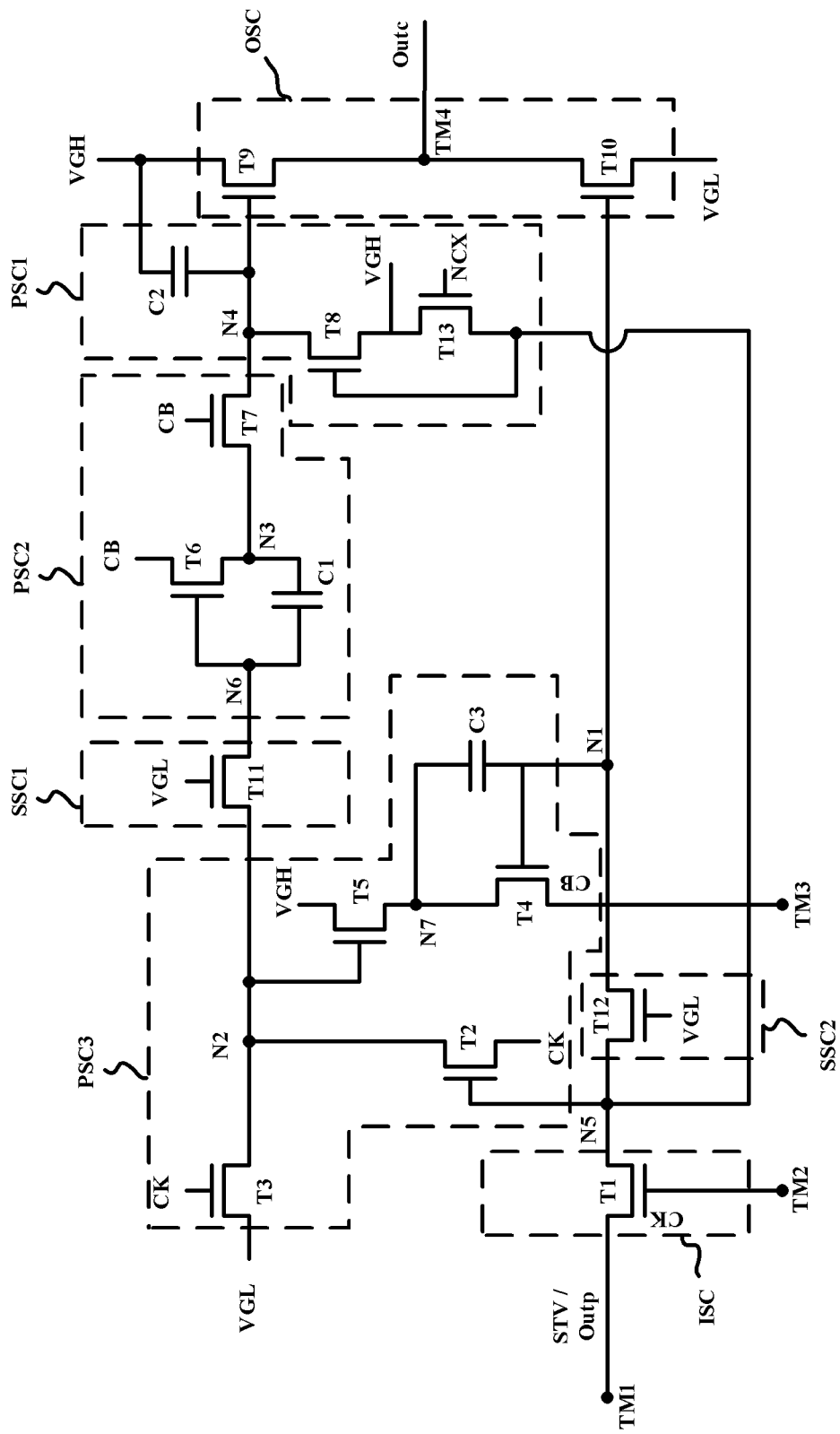
FIG. 28 is a circuit diagram of a respective scan unit in some embodiments according to the present disclosure.

FIG. 28 is a circuit diagram of a respective scan unit in some embodiments according to the present disclosure. The scan unit in FIG. 28 differs from the scan unit in FIG. 27 in that the first processing subcircuit PSC1 further includes a thirteenth transistor T13. The thirteenth transistor T13 is coupled between the first power supply VGH and the fifth node N5. A gate electrode of the thirteenth transistor T13 is coupled to a signal terminal NCX. The thirteenth transistor T13 may be turned on or off depending on the voltage of the signal terminal NCX. Optionally, when the thirteenth transistor T13 is turned on, the voltage of the first power supply VGH may be provided to the fifth node N5.

In another aspect, the present invention provides a display apparatus, including the scan circuit described herein or fabricated by a method described herein, and a display panel having a plurality of light emitting elements. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a quantum dots display apparatus.

The scan circuit described in the present disclosure may be used for generating various appropriate control signals to subpixels in a display panel. In one example, the scan circuit described in the present disclosure is a light emitting control signal generating circuit configured to generate light emitting control signals for subpixels in a display panel. In another example, the scan circuit described in the present disclosure is a gate scanning signal generating circuit configured to generate gate scanning signals for subpixels in a display panel. In another example, the scan circuit described in the present disclosure is a reset control signal generating circuit configured to generate reset control signals for subpixels in a display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of driving a scan circuit, comprising providing N1 number of first clock signals time-sequentially to (k*N1) number of stages of the scan circuit, respectively, the (k*N1) number of stages comprising M number of groups, a respective group of the M number of groups comprising one or more stages of the scan circuit, N1, k, M being integers; N1≥2, k≥1; M≥2;

wherein a respective first clock signal of the N1 number of first clock signals comprises a first level component and a second level component following the first level component;

a m-th group of the M number of groups is configured to receive first clock signals before a (m+1)-th group of the M number of groups receives first clock signals, 1≤m≤(M−1);

with respect to N2 number of data enabling signals, a difference between a starting point of a first level component of an n1-th first clock signal and a starting point of an n2-th data enabling signal of the N2 number of data enabling signals is equal to $t_{m1}$, N2=N1, n2=n1;

values of $t_{m1}$ for first clock signals provided to different groups of the M number of groups are different; and the N2 number of data enabling signals are signals provided to a timing controller coupled to the scan circuit, and configured to control a timing of data output;

wherein, with respect to N3 number of first reference periods, a difference between a starting point of a first level component of an n1-th first clock signal and a starting point of an n3-th first reference period of the N3 number of first reference periods is equal to $t_{mA}$, N3=N1, n3=n1;

durations of the N3 number of first reference periods are the same;

an N3-th first reference period of the N3 number of first reference periods overlaps with an N1-th period of the N1 number of first clock signals;

at least a first period of the N1 number of first clock signals is partially non-overlapping with a $1^{st}$ first reference period of the N3 number of first reference periods; and values of $t_{mA}$ for first clock signals provided to different groups of the M number of groups are different.

2. The method of claim 1, wherein the values of $t_{m1}$ for first clock signals provided to different groups of the M number of groups gradually increase group-by-group.

3. The method of claim 1, wherein a value of $t_{m1}$ for first clock signals provided to a m-th group of the M number of groups is less than a value of $t_{m1}$ for first clock signals provided to a (m+1)-th group of the M number of groups; and values of $t_{m1}$ for first clock signals provided to a same group of the M number of groups are the same.

4. The method of claim 1, wherein a value of $t_{m1}$ for first clock signals provided to a m-th group of the M number of groups is greater than a value of $t_{mA}$ for first clock signals provided to a (m+1)-th group of the M number of groups, 1≤m≤(M−1).

5. The method of claim 1, further comprising outputting (k*N1) number of output control signals from the (k*N1) number of stages of the scan circuit, respectively;

wherein starting points of the (k*N1) number of output control signals are equi-spaced.

6. The method of claim 1, wherein duty cycles of first clock signals provided to the M number of groups are the same.

7. The method of claim 1, wherein duty cycles of first clock signals provided to the M number of groups gradually increase group-by-group.

8. The method of claim 1, further comprising providing an integrated circuit;

wherein a (m+1)-th group of the M number of groups is closer to the integrated circuit than a m-th group of the M number of groups, 1≤m≤(M−1).

9. The method of claim 1, further comprising:

providing a first clock signal line; and providing a modulation circuit configured to convert original first clock signals transmitted by the first clock signal line into the N1 number of first clock signals time-sequentially provided to the (k*N1) number of stages, respectively;
wherein the modulation circuit comprises:
a first transistor;
a first resistance;
a second resistance;
a first capacitor; and
a triode;
wherein a first electrode of the first transistor is coupled to the first clock signal line and a first terminal of the first resistance;
a second electrode of the first transistor is coupled to the triode;
a second terminal of the first resistance is coupled to a first electrode of the first capacitor and a first terminal of the second resistance;
a gate electrode of the first transistor is coupled to a second terminal of the second resistance; and
an output terminal of the triode is coupled to the (k*N1) number of stages;
wherein the method further comprises providing, through the modulation circuit, N1 number of first clock signals time-sequentially to the (k*N1) number of stages, respectively;
wherein the method further comprises gradually increasing a resistance value of the first resistance thereby gradually increasing values of $t_{m1}$ for first clock signals provided to the M number of groups group-by-group.

10. A method of driving a scan circuit, comprising:
providing N1 number of first clock signals time-sequentially to (k*N1) number of stages of the scan circuit, respectively, the (k*N1) number of stages comprising M number of groups, a respective group of the M number of groups comprising one or more stages of the scan circuit, N1, k, M being integers; N1≥2, k≥1; M≥2; and
providing N4 number of second clock signals time-sequentially to (k*N4) number of stages of the scan circuit, respectively, N4=N1;
wherein a respective first clock signal of the N1 number of first clock signals comprises a first level component and a second level component following the first level component;
a m-th group of the M number of groups is configured to receive first clock signals before a (m+1)-th group of the M number of groups receives first clock signals, 1≤m≤(M−1);
with respect to N2 number of data enabling signals, a difference between a starting point of a first level component of an n1-th first clock signal and a starting point of an n2-th data enabling signal of the N2 number of data enabling signals is equal to $t_{m1}$, N2=N1, n2=n1;
values of $t_{m1}$ for first clock signals provided to different groups of the M number of groups are different; and
the N2 number of data enabling signals are signals provided to a timing controller coupled to the scan circuit, and configured to control a timing of data output;
wherein a respective second clock signal of the N4 number of second clock signals comprises a third level component and a fourth level component following the third level component; a m-th group of the M number of groups is configured to receive second clock signals before a (m+1)-th group of the M number of groups receives second clock signals;
with respect to the N2 number of data enabling signals, a difference between a starting point of a third level component of an n4-th second clock signal and a starting point of the n2-th data enabling signal of the N2 number of data enabling signals is equal to $t_{m2}$, n4=n2; and
values of $t_{m2}$ for second clock signals provided to different groups of the M number of groups are different.

11. The method of claim 10, wherein values of $t_{m2}$ for second clock signals provided to different groups of the M number of groups gradually increase group-by-group.

12. The method of claim 10, wherein a value of $t_{m2}$ for second clock signals provided to a m-th group of the M number of groups is less than a value of $t_{m2}$ for second clock signals provided to a (m+1)-th group of the M number of groups; and
values of $t_{m2}$ for second clock signals provided to a same group of the M number of groups are the same.

13. The method of claim 10, wherein, with respect to N5 number of second reference periods, a difference between a starting point of a third level component of an n4-th second clock signal and a starting point of an n5-th second reference period of the N5 number of second reference periods is equal to $t_{mB}$, N5=N1, n4=n5;
durations of the N5 number of second reference periods are the same;
an N5-th second reference period of the N5 number of second reference periods overlaps with an N4-th period of the N4 number of second clock signals;
at least a first period of the N4 number of second clock signals is partially non-overlapping with a $1^{st}$ second reference period of the N5 number of second reference periods; and
values of $t_{mB}$ for second clock signals provided to different groups of the M number of groups are different.

14. The method of claim 13, wherein a value of $t_{mB}$ for second clock signals provided to a m-th group of the M number of groups is greater than a value of $t_{m2}$ for second clock signals provided to a (m+1)-th group of the M number of groups, 1≤m≤(M−1).

15. A scan circuit, comprising:
(k*N) number of stages;
a first clock signal line; and
a modulation circuit configured to convert original first clock signals transmitted by the first clock signal line into N1 number of first clock signals time-sequentially provided to the (k*N1) number of stages, respectively;
wherein the (k*N1) number of stages comprise M number of groups, a respective group of the M number of groups comprises one or more stages of the scan circuit, N1, k, M being integers; N1≥2, k≥1; M≥2;
a respective first clock signal of the N1 number of first clock signals comprises a first level component and a second level component following the first level component;
a m-th group of the M number of groups is configured to receive first clock signals before a (m+1)-th group of the M number of groups receives first clock signals, 1≤m≤(M−1);
with respect to N2 number of data enabling signals, a difference between a starting point of a first level component of an n1-th first clock signal and a starting point of an n2-th data enabling signal of the N2 number of data enabling signals is equal to $t_{m1}$, N2=N1, n2=n1;
values of $t_{m1}$ for first clock signals provided to different groups of the M number of groups are different; and the N2 number of data enabling signals are signals provided to a timing controller coupled to the scan circuit, and configured to control a timing of data output;

wherein the modulation circuit comprises:
a first transistor;
a first resistance;
a second resistance;
a first capacitor; and
a triode;
wherein a first electrode of the first transistor is coupled to the first clock signal line and a first terminal of the first resistance;
a second electrode of the first transistor is coupled to the triode;
a second terminal of the first resistance is coupled to a first electrode of the first capacitor and a first terminal of the second resistance;
a gate electrode of the first transistor is coupled to a second terminal of the second resistance; and
an output terminal of the triode is coupled to the (k*N) number of stages.

16. The scan circuit of claim 15, further comprising a second clock signal line;
wherein the modulation circuit is further configured to configured to convert original second clock signals transmitted by the second clock signal line into N4 number of second clock signals time-sequentially provided to the (k*N) number of stages, respectively, N4=N1;
a respective second clock signal of the N4 number of second clock signals comprises a third level component and a fourth level component following the third level component;
a m-th group of the M number of groups is configured to receive second clock signals before a (m+1)-th group of the M number of groups receives second clock signals;
with respect to the N2 number of data enabling signals, a difference between a starting point of a third level component of an n4-th second clock signal and a starting point of the n2-th data enabling signal of the N2 number of data enabling signals is equal to $t_{m2}$, n4=n2; and
values of $t_{m2}$ for second clock signals provided to different groups of the M number of groups are different.

17. The scan circuit of claim 16, wherein the modulation circuit comprises:
a first transistor;
a first resistance;
a second resistance;
a first capacitor;
a second transistor;
a third resistance;
a fourth resistance;
a second capacitor; and
a triode;
wherein a first electrode of the first transistor is coupled to the first clock signal line and a first terminal of the first resistance;
a second electrode of the first transistor is coupled to the triode;
a second terminal of the first resistance is coupled to a first electrode of the first capacitor and a first terminal of the second resistance;
a gate electrode of the first transistor is coupled to a second terminal of the second resistance;
a first electrode of the second transistor is coupled to the second clock signal line and a first terminal of the third resistance;
a second electrode of the second transistor is coupled to the triode;
a second terminal of the third resistance is coupled to a first electrode of the second capacitor and a first terminal of the fourth resistance;
a gate electrode of the second transistor is coupled to a second terminal of the fourth resistance; and
an output terminal of the triode is coupled to the (k*N) number of stages.

18. A display apparatus, comprising the scan circuit of claim 15, and an integrated circuit connected to the first clock signal line.

* * * * *